(12) United States Patent
Lucas et al.

(10) Patent No.: US 9,443,601 B2
(45) Date of Patent: Sep. 13, 2016

(54) HOLDUP CAPACITOR ENERGY HARVESTING

(71) Applicant: SanDisk Enterprise IP LLC, Milpitas, CA (US)

(72) Inventors: Gregg S. Lucas, Tucson, AZ (US); Robert W. Ellis, Phoenix, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/479,559

(22) Filed: Sep. 8, 2014

(65) Prior Publication Data

US 2016/0071609 A1    Mar. 10, 2016

(51) Int. Cl.
| | |
|---|---|
| G11C 16/04 | (2006.01) |
| G11C 16/30 | (2006.01) |
| G06F 1/30 | (2006.01) |
| G06F 11/14 | (2006.01) |
| G11C 5/14 | (2006.01) |
| G11C 16/22 | (2006.01) |

(52) U.S. Cl.
CPC .............. *G11C 16/30* (2013.01); *G06F 1/30* (2013.01); *G06F 11/14* (2013.01); *G06F 11/1412* (2013.01); *G11C 5/148* (2013.01); *G11C 16/225* (2013.01)

(58) Field of Classification Search
CPC ..... G11C 16/30; G06F 1/30; G06F 11/1412; G06F 11/14
USPC ........................................... 365/185.18, 227
See application file for complete search history.

(56) References Cited

U.S. PATENT DOCUMENTS

| | | | |
|---|---|---|---|
| 4,173,737 | A | 11/1979 | Skerlos et al. |
| 4,888,750 | A | 12/1989 | Kryder et al. |
| 4,916,652 | A | 4/1990 | Schwarz et al. |
| 5,129,089 | A | 7/1992 | Nielsen |
| 5,270,979 | A | 12/1993 | Harari et al. |

(Continued)

FOREIGN PATENT DOCUMENTS

| | | |
|---|---|---|
| EP | 1 299 800 | 4/2003 |
| EP | 1 465 203 A1 | 10/2004 |

(Continued)

OTHER PUBLICATIONS

Invitation to Pay Additional Fees dated Feb. 13, 2015, received in International Patent Application No. PCT/US2014/063949, which corresponds to U.S. Appl. No. 14/135,433, 6 pages (Delpapa).

(Continued)

*Primary Examiner* — Toan Le
(74) *Attorney, Agent, or Firm* — Morgan, Lewis & Bockius LLP

(57) ABSTRACT

The various embodiments described herein include circuits, methods and/or devices used to protect data in a storage device. In one aspect, a method includes performing a power fail operation on a first section of the storage device. The power fail operation includes supplying power, via an energy storage device, to the first section of the storage device, where the energy storage device is distinct from a power source used during normal operation of the storage device, and where supplying power via the energy storage device includes switching the output of the energy storage device from an output of a boost regulator to an input of the boost regulator. The power fail operation also includes performing data hardening on the first section of the storage device.

24 Claims, 10 Drawing Sheets

(56) References Cited

U.S. PATENT DOCUMENTS

| | | |
|---|---|---|
| 5,329,491 A | 7/1994 | Brown et al. |
| 5,381,528 A | 1/1995 | Brunelle |
| 5,404,485 A | 4/1995 | Ban |
| 5,519,847 A | 5/1996 | Fandrich et al. |
| 5,530,705 A | 6/1996 | Malone |
| 5,537,555 A | 7/1996 | Landry |
| 5,551,003 A | 8/1996 | Mattson et al. |
| 5,636,342 A | 6/1997 | Jeffries |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevallier |
| 5,936,884 A | 8/1999 | Hasbun et al. |
| 5,943,692 A | 8/1999 | Marberg et al. |
| 5,946,714 A | 8/1999 | Miyauchi |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,044,472 A | 3/2000 | Crohas |
| 6,119,250 A | 9/2000 | Nishimura et al. |
| 6,260,120 B1 | 7/2001 | Blumenau et al. |
| 6,295,592 B1 | 9/2001 | Jeddeloh et al. |
| 6,311,263 B1 | 10/2001 | Barlow et al. |
| 6,408,394 B1 | 6/2002 | Vander Kamp et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,564,285 B1 | 5/2003 | Mills et al. |
| 6,647,387 B1 | 11/2003 | McKean et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,966,006 B2 | 11/2005 | Pacheco et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,024,514 B2 | 4/2006 | Mukaida et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader et al. |
| 7,102,860 B2 | 9/2006 | Wenzel |
| 7,111,293 B1 | 9/2006 | Hersh et al. |
| 7,126,873 B2 | 10/2006 | See et al. |
| 7,133,282 B2 | 11/2006 | Sone |
| 7,155,579 B1 | 12/2006 | Neils et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,212,440 B2 | 5/2007 | Gorobets |
| 7,275,170 B2 | 9/2007 | Suzuki |
| 7,295,479 B2 | 11/2007 | Yoon et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,546,478 B2 | 6/2009 | Kubo et al. |
| 7,566,987 B2 | 7/2009 | Black et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,669,003 B2 | 2/2010 | Sinclair et al. |
| 7,681,106 B2 | 3/2010 | Jarrar et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,971,112 B2 | 6/2011 | Murata |
| 7,978,516 B2 | 7/2011 | Olbrich |
| 7,996,642 B1 | 8/2011 | Smith |
| 8,032,724 B1 | 10/2011 | Smith |
| 8,041,884 B2 | 10/2011 | Chang |
| 8,042,011 B2 | 10/2011 | Nicolaidis et al. |
| 8,250,380 B2 | 8/2012 | Guyot |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,627,117 B2 | 1/2014 | Johnston |
| 8,634,248 B1 | 1/2014 | Sprouse et al. |
| 8,694,854 B1 | 4/2014 | Dar et al. |
| 8,724,789 B2 | 5/2014 | Altberg et al. |
| 8,832,384 B1 | 9/2014 | de la Iglesia |
| 8,885,434 B2 | 11/2014 | Kumar |
| 8,898,373 B1 | 11/2014 | Kang et al. |
| 8,909,894 B1 | 12/2014 | Singh et al. |
| 8,910,030 B2 | 12/2014 | Goel |
| 8,923,066 B1 | 12/2014 | Subramanian et al. |
| 9,043,517 B1 | 5/2015 | Sprouse et al. |
| 9,128,690 B2 | 9/2015 | Lotzenburger et al. |
| 2001/0050824 A1 | 12/2001 | Buch |
| 2002/0024846 A1 | 2/2002 | Kawahara et al. |
| 2002/0036515 A1 | 3/2002 | Eldridge et al. |
| 2002/0083299 A1 | 6/2002 | Van Huben et al. |
| 2002/0099904 A1 | 7/2002 | Conley |
| 2002/0116651 A1 | 8/2002 | Beckert et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid |
| 2003/0079172 A1 | 4/2003 | Yamagishi et al. |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0204341 A1 | 10/2003 | Guliani et al. |
| 2003/0212719 A1 | 11/2003 | Yasuda et al. |
| 2003/0225961 A1 | 12/2003 | Chow et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0085849 A1 | 5/2004 | Myoung et al. |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0210706 A1 | 10/2004 | In et al. |
| 2004/0237018 A1 | 11/2004 | Riley |
| 2005/0060456 A1 | 3/2005 | Shrader et al. |

(56) References Cited

U.S. PATENT DOCUMENTS

| | | |
|---|---|---|
| 2005/0060501 A1 | 3/2005 | Shrader |
| 2005/0073884 A1 | 4/2005 | Gonzalez et al. |
| 2005/0108588 A1 | 5/2005 | Yuan |
| 2005/0114587 A1 | 5/2005 | Chou et al. |
| 2005/0138442 A1 | 6/2005 | Keller et al. |
| 2005/0144358 A1 | 6/2005 | Conley et al. |
| 2005/0144361 A1 | 6/2005 | Gonzalez et al. |
| 2005/0144367 A1 | 6/2005 | Sinclair |
| 2005/0144516 A1 | 6/2005 | Gonzalez et al. |
| 2005/0154825 A1 | 7/2005 | Fair |
| 2005/0172065 A1 | 8/2005 | Keays |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0281088 A1 | 12/2005 | Ishidoshiro et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0069932 A1 | 3/2006 | Oshikawa et al. |
| 2006/0085671 A1 | 4/2006 | Majni et al. |
| 2006/0087893 A1 | 4/2006 | Nishihara et al. |
| 2006/0103480 A1 | 5/2006 | Moon et al. |
| 2006/0107181 A1 | 5/2006 | Dave et al. |
| 2006/0136570 A1 | 6/2006 | Pandya |
| 2006/0136655 A1 | 6/2006 | Gorobets et al. |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0101096 A1 | 5/2007 | Gorobets |
| 2007/0113019 A1 | 5/2007 | Beukema |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0191993 A1 | 8/2007 | Wyatt |
| 2007/0201274 A1 | 8/2007 | Yu et al. |
| 2007/0204128 A1 | 8/2007 | Lee et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwell et al. |
| 2007/0268754 A1 | 11/2007 | Lee et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0052451 A1 | 2/2008 | Pua et al. |
| 2008/0059602 A1 | 3/2008 | Matsuda et al. |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0204823 A1 | 8/2009 | Giordano et al. |
| 2009/0207660 A1 | 8/2009 | Hwang et al. |
| 2009/0213649 A1 | 8/2009 | Takahashi et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1* | 1/2010 | Cagno .............. G06F 11/1064 714/719 |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0115206 A1 | 5/2010 | de la Iglesia et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0199027 A1 | 8/2010 | Pucheral et al. |
| 2010/0199125 A1 | 8/2010 | Reche |
| 2010/0199138 A1 | 8/2010 | Rho |
| 2010/0202196 A1 | 8/2010 | Lee et al. |
| 2010/0202239 A1 | 8/2010 | Moshayedi et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0306222 A1 | 12/2010 | Freedman et al. |
| 2010/0332858 A1 | 12/2010 | Trantham et al. |
| 2010/0332863 A1 | 12/2010 | Johnston |
| 2011/0010514 A1 | 1/2011 | Benhase et al. |
| 2011/0022779 A1 | 1/2011 | Lund et al. |
| 2011/0022819 A1 | 1/2011 | Post et al. |

(56) References Cited

U.S. PATENT DOCUMENTS

| | | |
|---|---|---|
| 2011/0051513 A1 | 3/2011 | Shen et al. |
| 2011/0066597 A1 | 3/2011 | Mashtizadeh et al. |
| 2011/0066806 A1 | 3/2011 | Chhugani et al. |
| 2011/0072302 A1 | 3/2011 | Sartore |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |
| 2011/0239077 A1 | 9/2011 | Bai et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2011/0289125 A1 | 11/2011 | Guthery |
| 2011/0320733 A1 | 12/2011 | Sanford et al. |
| 2012/0011393 A1 | 1/2012 | Roberts et al. |
| 2012/0017053 A1 | 1/2012 | Yang et al. |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0117397 A1 | 5/2012 | Kolvick et al. |
| 2012/0131286 A1 | 5/2012 | Faith et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0173826 A1 | 7/2012 | Takaku |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0210095 A1 | 8/2012 | Nellans et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239868 A1 | 9/2012 | Ryan et al. |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0038380 A1 | 2/2013 | Cordero et al. |
| 2013/0047045 A1 | 2/2013 | Hu et al. |
| 2013/0070527 A1 | 3/2013 | Sabbag et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0117606 A1 | 5/2013 | Anholt et al. |
| 2013/0121084 A1 | 5/2013 | Jeon et al. |
| 2013/0124792 A1 | 5/2013 | Melik-Martirosian et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194865 A1 | 8/2013 | Bandic et al. |
| 2013/0194874 A1 | 8/2013 | Mu et al. |
| 2013/0232289 A1 | 9/2013 | Zhong et al. |
| 2013/0238576 A1 | 9/2013 | Binkert et al. |
| 2013/0254507 A1 | 9/2013 | Islam et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0297613 A1 | 11/2013 | Yu |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2013/0346672 A1 | 12/2013 | Sengupta et al. |
| 2014/0013027 A1 | 1/2014 | Venkata et al. |
| 2014/0013188 A1 | 1/2014 | Wu et al. |
| 2014/0032890 A1 | 1/2014 | Lee et al. |
| 2014/0063905 A1 | 3/2014 | Ahn et al. |
| 2014/0075133 A1 | 3/2014 | Li et al. |
| 2014/0082261 A1 | 3/2014 | Cohen et al. |
| 2014/0082310 A1 | 3/2014 | Nakajima |
| 2014/0082456 A1 | 3/2014 | Liu |
| 2014/0095775 A1 | 4/2014 | Talagala et al. |
| 2014/0101389 A1 | 4/2014 | Nellans et al. |
| 2014/0122818 A1 | 5/2014 | Hayasaka et al. |
| 2014/0122907 A1 | 5/2014 | Johnston |
| 2014/0136762 A1 | 5/2014 | Li et al. |
| 2014/0136883 A1 | 5/2014 | Cohen |
| 2014/0136927 A1 | 5/2014 | Li et al. |
| 2014/0143505 A1 | 5/2014 | Sim et al. |
| 2014/0181458 A1 | 6/2014 | Loh et al. |
| 2014/0201596 A1 | 7/2014 | Baum et al. |
| 2014/0223084 A1 | 8/2014 | Lee et al. |
| 2014/0258755 A1* | 9/2014 | Stenfort .............. G06F 1/30 713/323 |
| 2014/0269053 A1* | 9/2014 | Chen ................ G11C 7/24 365/185.03 |
| 2014/0269090 A1 | 9/2014 | Flynn et al. |
| 2014/0310494 A1 | 10/2014 | Higgins et al. |
| 2014/0359381 A1 | 12/2014 | Takeuchi et al. |
| 2015/0023097 A1 | 1/2015 | Khoueir et al. |
| 2015/0037624 A1 | 2/2015 | Thompson et al. |
| 2015/0149806 A1* | 5/2015 | Lucas ............... G06F 11/1441 713/330 |
| 2015/0153799 A1* | 6/2015 | Lucas ............... G06F 1/263 713/300 |
| 2015/0153802 A1* | 6/2015 | Lucas ............... G06F 11/1402 714/22 |
| 2015/0212943 A1 | 7/2015 | Yang et al. |

FOREIGN PATENT DOCUMENTS

| | | |
|---|---|---|
| EP | 2 386 958 A1 | 11/2011 |
| EP | 2 620 946 A2 | 7/2013 |
| JP | 2002-532806 | 10/2002 |
| WO | WO 2007/080586 | 7/2007 |
| WO | WO 2008/075292 | 6/2008 |
| WO | WO 2008/121553 | 10/2008 |
| WO | WO 2008/121577 | 10/2008 |
| WO | WO 2009/058140 | 5/2009 |
| WO | WO 2009/084724 | 7/2009 |
| WO | WO 2009/134576 | 11/2009 |
| WO | WO 2011/024015 | 3/2011 |

OTHER PUBLICATIONS

International Search Report and Written Opinion dated Jan. 21, 2015, received in International Application No. PCT/US2014/059748, which corresponds to U.S. Appl. No. 14/137,511, 13 pages (Dancho).

(56) References Cited

OTHER PUBLICATIONS

International Search Report and Written Opinion dated Feb. 18, 2015, received in International Application No. PCT/US2014/066921, which corresponds to U.S. Appl. No. 14/135,260, 13 pages (Fitzpatrick).
Ashkenazi et al., "Platform independent overall security architecture in multi-processor system-on-chip integrated circuits for use in mobile phones and handheld devices," ScienceDirect, Computers and Electrical Engineering 33 (2007), 18 pages.
Lee et al., "A Semi-Preemptive Garbage Collector for Solid State Drives," Apr. 2011, IEEE, pp. 12-21.
Office Action dated Feb. 17, 2015, received in Chinese Patent Application No. 201210334987.1, which corresponds to U.S. Appl. No. 12/082,207, 9 pages (Prins).
International Search Report and Written Opinion dated May 4, 2015, received in International Patent Application No. PCT/US2014/065987, which corresponds to U.S. Appl. No. 14/135,400, 12 pages (George).
International Search Report and Written Opinion dated Mar. 17, 2015, received in International Patent Application No. PCT/US2014/067467, which corresponds to U.S. Appl. No. 14/135,420, 13 pages (Lucas).
International Search Report and Written Opinion dated Apr. 20, 2015, recieved in International Patent Application No. PCT/US2014/063949, which corresponds to U.S. Appl. No. 14/135,433, 21 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
International Search Report and Written Opinion dated Sep. 14, 2015, received in International Patent Application No. PCT/US2015/036807, which corresponds to U.S. Appl. No. 14/311,152, 9 pages (Higgins).
Barr, "Introduction to Watchdog Timers," Oct. 2001, 3 pgs.
Canim, "Buffered Bloom Filters on Solid State Storage," ADMS*10, Singapore, Sep. 13-17, 2010, 8 pgs.
Kang, "A Multi-Channel Architecture for High-Performance NAND Flash-Based Storage System," J. Syst. Archit., vol. 53, Issue 9, Sep. 2007, 15 pgs.
Kim, "A Space-Efficient Flash Translation Layer for CompactFlash Systems," May 2002, IEEE vol. 48, No. 2, 10 pgs.
Lu, "A Forest-structured Bloom Filter with Flash Memory." MSST 2011, Denver, CO, May 23-27, 2011, article, 6 pgs.
Lu, "A Forest-structured Bloom Filter with Flash Memory," MSST 2011, Denver, CO, May 23-27, 2011, presentation slides, 25 pgs.
McLean, "Information Technology-AT Attachment with Packet Interface Extension," Aug. 19, 1998, 339 pgs.
Microchip Technology, "Section 10. Watchdog Timer and Power-Saving Modes," 2005, 14 pages.
Park et al., "A High Performance Controller for NAND Flash-Based Solid State Disk (NSSD)," Proceedings of Non-Volatile Semiconductor Memory Workshop, Feb. 2006, 4 pgs.
Zeidman, 1999 Verilog Designer's Library, 9 pgs.
International Search Report and Written Opinion dated Jun. 6, 2013, received in International Patent Application No. PCT/US2012/059447, which corresponds to U.S. Appl. No. 13/602,031, 12 pgs (Tai).
International Search Report and Written Opinion, dated Mar. 19, 2009 received in International Patent Application No. PCT/US08/88133, which corresponds to U.S. Appl. No. 12/082,202, 7 pgs (Prins).
International Search Report and Written Opinion dated Feb. 19, 2009, received in International Patent Application No. PCT/US08/88236, which corresponds to U.S. Appl. No. 12/082,203, 7 pgs (Olbrich).
International Search Report and Written Opinion dated Feb. 19, 2009, received in International Patent Application No. PCT/US08/88217, which corresponds to U.S. Appl. No. 12/082,204, 7 pgs (Olbrich).
International Search Report and Written Opinion, dated Mar. 19, 2009, received in International Patent Application No. PCT/US08/88136, which corresponds to U.S. Appl. No. 12/082,205, 7 pgs (Olbrich).
International Search Report and Written Opinion dated Feb. 18, 2009, received in International Patent Application No. PCT/US08/88206, which corresponds to U.S. Appl. No. 12/082,206, 7 pgs (Prins).
International Search Report and Written Opinion dated Feb. 27, 2009, received in International Patent Application No. PCT/US2008/088154, which corresponds to U.S. Appl. No. 12/082,207, 8 pgs (Prins).
European Search Report dated Feb. 23, 2012, received in European Patent Application No. 08866997.3, which corresponds to U.S. Appl. No. 12/082,207, 6 pgs (Prins).
Office Action dated Apr. 18, 2012, received in Chinese Patent Application No. 200880127623.8, which corresponds to U.S. Appl. No. 12/082,207, 12 pgs (Prins).
Office Action dated Dec. 31, 2012, received in Chinese Patent Application No. 200880127623.8, which corresponds to U.S. Appl. No. 12/082,207, 9 pgs (Prins).
Notification of the Decision to Grant a Patent Right for Patent for Invention dated Jul. 4, 2013, received in Chinese Patent Application No. 200880127623.8, which corresponds to U.S. Appl. No. 12/082,207, 1 pg (Prins).
Office Action dated Jul. 24, 2012, received in Japanese Patent Application No. JP 2010-540863, 3 pgs (Prins).
International Search Report and Written Opinion dated Feb. 13, 2009, received in International Patent Application No. PCT/US08/88164, which corresponds to U.S. Appl. No. 12/082,220, 6 pgs (Olbrich).
International Search Report and Written Opinion dated Feb. 26, 2009, received in International Patent Application No. PCT/US08/88146, which corresponds to U.S. Appl. No. 12/082,221, 10 pgs (Prins).
International Search Report and Written Opinion dated Feb. 19, 2009, received in International Patent Application No. PCT/US08/88232, which corresponds to U.S. Appl. No. 12/082,222, 8 pgs (Olbrich.).
International Search Report and Written Opinion dated Feb. 13, 2009, received in International Patent Application No. PCT/US08/88229, which corresponds to U.S. Appl. No. 12/082,223, 7 pgs. (Olbrich).
International Search Report and Written Opinion dated Oct. 27, 2011, received in International Patent Application No. PCT/US2011/028637, which corresponds to U.S. Appl. No. 12/726,200, 13 pgs (Olbrich).
International Search Report and Written Opinion dated Aug. 31, 2012, received in International Patent Application PCT/US2012/042764 which corresponds to U.S. Appl. No. 13/285,873, 12 pgs (Frayer).
International Search Report and Written Opinion dated Mar. 4, 2013, received in PCT/US2012/042771, which corresponds to U.S. Appl. No. 13/286,012, 14 pgs (Stonelake).
International Search Report and Written Opinion dated Sep. 26, 2012, received in International Patent Application No. PCT/US2012/042775, which corresponds to U.S. Appl. No. 13/285,892, 8 pgs (Weston-Lewis et al.).
International Search Report and Written Opinion dated Jun. 6, 2013, received in International Patent Application No. PCT/US2012/059453, which corresponds to U.S. Appl. No. 13/602,039, 12 pgs (Frayer).
International Search Report and Written Opinion dated Feb. 14, 2013, received in International Patent Application No. PCT/US2012/059459, which corresponds to U.S. Appl. No. 13/602,047, 9 pgs (Tai).
International Search Report and Written Opinion dated Jul. 25, 2014, received in International Patent Application No. PCT/US2014/029453, which corresponds to U.S. Appl. No. 13/963,444, 9 pages (Frayer).

(56) References Cited

OTHER PUBLICATIONS

International Search Report and Written Opinion dated Mar. 7, 2014, received in International Patent Application No. PCT/US2013/074772, which corresponds to U.S. Appl. No. 13/831,218, 10 pages (George).

International Search Report and Written Opinion dated Mar. 24, 2014, received in International Patent Application No. PCT/US2013/074777, which corresponds to U.S. Appl. No. 13/831,308, 10 pages (George).

International Search Report and Written Opinion dated Mar. 7, 2014, received in International Patent Application No. PCT/US2013/074779, which corresponds to U.S. Appl. No. 13/831,374, 8 pages (George).

Bayer, "Prefix B-Trees", IP.com Journal, IP.com Inc., West Henrietta, NY, Mar. 30, 2007, 29 pages.

Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.

Oracle, "Oracle9i: Database Concepts", Jul. 2001, http://docs.oracle.com/cd/A91202_01/901_doc/server.901/a88856.pdf, 49 pages.

Office Action dated Dec. 8, 2014, received in Chinese Patent Application No. 201180021660.2, which corresponds to U.S. Appl. No. 12/726,200, 7 pages (Olbrich).

Office Action dated Jul. 31, 2015, received in Chinese Patent Application No. 201180021660.2, which corresponds to U.S. Appl. No. 12/726,200, 9 pages (Olbrich).

International Search Report and Written Opinion dated Jun. 8, 2015, received in International Patent Application No. PCT/US2015/018252, which corresponds to U.S. Appl. No. 14/339,072, 9 pages (Busch).

International Search Report and Written Opinion dated Jun. 2, 2015, received in International Patent Application No. PCT/US2015/018255, which corresponds to U.S. Appl. No. 14/336,967, 14 pages (Chander).

International Search Report and Written Opinion dated Jun. 30, 2015, received in International Patent Application No. PCT/US2015/023927, which corresponds to U.S. Appl. No. 14/454,687, 11 pages (Kadayam).

International Search Report and Written Opinion dated Jul. 23, 2015, received in International Patent Application No. PCT/US2015/030850, which corresponds to U.S. Appl. No. 14/298,843, 12 pages (Ellis).

Gasior, "Gigabyte's i-Ram storage device, Ram disk without the fuss," The Tech Report, p. 1, Jan. 25, 2006, 5 pages.

IBM Research-Zurich, "The Fundamental Limit of Flash Random Write Performance: Understanding, Analysis and Performance Modeling," Mar. 31, 2010, pp. 1-15.

Oestreicher et al., "Object Lifetimes in Java Card," 1999, USENIX, 10 pages.

\* cited by examiner

HOLDUP CAPACITOR ENERGY HARVESTING

TECHNICAL FIELD

The disclosed embodiments relate generally to data storage systems, and in particular, to power management and data hardening architecture in storage devices (e.g., solid-state drives).

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Data hardening, the saving of data and mission critical metadata held in volatile storage, is an integral part of a storage device. When there is a power failure, mission critical data may reside in volatile memory in a number of sub-system components. Coordinating and managing multiple sub-system components to ensure that volatile data is saved successfully is important for safeguarding data integrity of a storage device. Storage devices with data hardening functionality sometimes use energy storage devices (e.g., holdup capacitor banks) to store energy for later use, if and when input power is lost. In these devices, power management is important to manage power demands on the host system during power-on conditions.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to enable power management and data hardening in storage devices (e.g., solid-state drives, sometimes called SSD's). In one aspect, a circuit comprises an energy storage device for providing power during a power fail operation to harden data, and a selector to couple the energy storage device to the output of a boost regulator during normal operation of the storage device, and to couple the energy storage device to the input of the boost regulator in response to receiving a first signal.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

Figure 1:
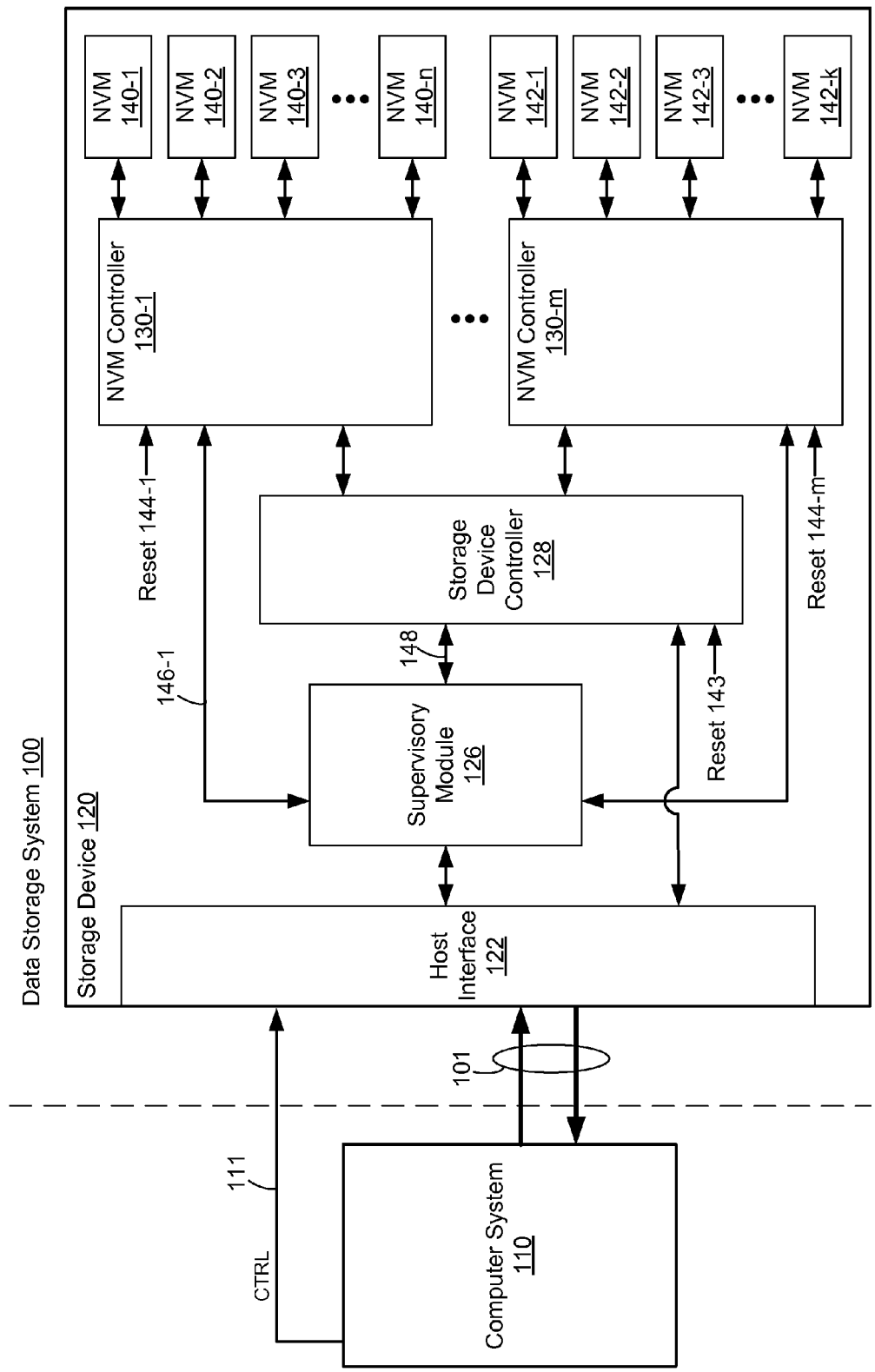
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include circuits, methods and/or devices used for power management and data hardening in storage devices. Some embodiments include circuits, methods and/or devices to perform a power fail operation.

(A1) In another aspect, some embodiments include a circuit to protect data in a storage device. In some embodiments, the circuit comprises (1) an energy storage device; (2) a boost regulator for boosting an input voltage; (3) a load switch for selectively coupling a power source to the input of the boost regulator, wherein the load switch is configured to de-couple the power source from the input of the boost regulator in response to receiving a power fail signal; (4) a selector for selectively coupling the energy storage device to either an input or an output of the boost regulator; and (5) a plurality of regulators coupled to the output of the boost regulator for supplying power to a first portion of the storage device. The selector is configured to couple the energy storage device to the output of the boost regulator during normal operation of the storage device; and the selector is further configured to couple the energy storage device to the input of the boost regulator in response to receiving a first signal.

(A2) In some embodiments of the circuit of A1, the first signal is the power fail signal.

(A3) In some embodiments of the circuit of A1, the first signal is a switchover signal, the switchover signal generated in response to a voltage output of the energy storage device falling below a predetermined threshold. In some embodiments, the circuit further comprises a comparator coupled to the energy storage device and the selector and the switchover signal is generated by the comparator.

(A4) In some embodiments of the circuit of A3, the predetermined threshold corresponds to a minimum input voltage required by at least one regulator in the plurality of regulators to supply useable power to the first portion of the storage device.

(A5) In some embodiments of the circuit of A1, the circuit further comprises a comparator having an output comprising the first signal. In some embodiments, an input of the comparator is coupled to a node of the circuit whose voltage is indicative of an operating condition of the circuit (e.g., $V_{storage}$ 311, FIG. 3B).

(A6) In some embodiments of the circuit of any of A1-A5, the energy storage device comprises one or more capacitors.

(A7) In some embodiments of the circuit of any of A1-A6, the first signal corresponds to a power fail operation.

(A8) In some embodiments of the circuit of any of A1-A7, In some embodiments, during normal operation, the energy storage device is used to buffer power spikes.

(A9) In some embodiments, a method of power management in a storage device includes performing a power fail operation on a first section of the storage device. The power fail operation includes supplying power, via an energy storage device, to the first section of the storage device, where the energy storage device is distinct from a power source used during normal operation of the storage device, and where supplying power via the energy storage device includes switching the output of the energy storage device from an output of a boost regulator to an input of the boost regulator. The power fail operation also includes performing data hardening on the first section of the storage device.

(A10) In some embodiments of the method of A9, switching the output of the energy storage device from the output of the boost regulator to the input of the boost regulator comprises switching the output of the energy storage device in response to receiving a first signal.

(A11) In some embodiments of the method of A10, the first signal is a power fail signal generated by a first controller on the storage device.

(A12) in Some Embodiments of the Method of A10, the First Signal is a switchover signal, the switchover signal generated in response to a voltage output of the energy storage device falling below a predetermined threshold.

(A13) In some embodiments of the method of A12, the predetermined threshold corresponds to a minimum input voltage required by at least one regulator in the plurality of regulators to supply useable power to the first portion of the storage device.

(A14) In some embodiments of the method of any of A9 to A13, the energy storage device comprises one or more capacitors.

(A15) In some embodiments of the method of any of A9 to A14, the method further comprises utilizing the energy storage device to buffer power spikes received from the power source used during normal operation of the storage device.

(A16) In some embodiments of the method of any of A9 to A15, the power fail operation is performed on the first section of the storage device in response to a second signal. In some embodiments, the second signal is distinct from the first signal. In some embodiments, the second signal is the first signal.

In yet another aspect, the method of any of A9 to A16 is performed by a storage device including: (1) memory, (2) one or more processors coupled to the memory, and (3) one or more programs, stored in the memory and executed by the one or more processors, the one or more programs including instructions for performing any of the methods described herein.

In yet another aspect, some embodiments include a non-transitory computer readable storage medium, storing one or more programs for execution by one or more processors of a storage device, the one or more programs including instructions for performing the method of any of A9 to A16.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1 is a block diagram illustrating an implementation of a data storage system 100, in accordance with some embodiments. While some example features are illustrated, various other features have not been illustrated for the sake of brevity and so as not to obscure more pertinent aspects of the example embodiments disclosed herein. To that end, as a non-limiting example, data storage system 100 includes storage device 120 (also sometimes called a data storage device, or information storage device, or a memory device), which includes host interface 122, supervisory module 126, storage device controller 128 (also sometimes called a storage controller or a memory controller), one or more non-volatile memory (NVM) controllers 130 such as flash controllers, and non-volatile memory (e.g., one or more NVM device(s) 140, 142 such as one or more flash memory devices), and is used in conjunction with computer system 110. In some embodiments, storage device 120 includes a single NVM device while in other embodiments storage device 120 includes a plurality of NVM devices. In some embodiments, NVM devices 140, 142 include NAND-type flash memory and/or NOR-type flash memory. Further, in some embodiments, NVM controller 130 is a solid-state drive (SSD) controller. However, one or more other types of storage media may be included in accordance with aspects of a wide variety of embodiments.

Computer system 110 is coupled to storage device 120 through data connections 101. In some embodiments computer system 110 includes storage device 120 as a component and/or sub-system. Computer system 110 may be any suitable computer device, such as a personal computer, a workstation, a computer server, or any other computing device. Computer system 110 is sometimes called a host or host system. In some embodiments, computer system 110 includes one or more processors, one or more types of memory, and optionally includes a display and/or other user interface components such as a keyboard, a touch screen display, a mouse, a track-pad, a digital camera and/or any number of supplemental devices to add functionality. Further, in some embodiments, computer system 110 sends one or more host commands (e.g., read commands and/or write commands) on control line 111 to storage device 120. In some embodiments, host interface 122 provides an interface to computer system 110 through data connections 101 and/or control line 111. In some embodiments, computer system 110 is a server system, such as a server system in a data center, and does not have a display and other user interface components.

In some embodiments, storage device 120 includes NVM devices such as flash memory devices (e.g., NVM devices 140-1 through 140-n and NVM devices 142-1 through 142-k) and NVM controllers 130 (e.g., NVM controllers 130-1 through 130-m). In some embodiments, each NVM controller of NVM controllers 130 include one or more processing units (also sometimes called CPUs or processors or microprocessors or microcontrollers) configured to execute instructions in one or more programs (e.g., in NVM controllers 130). In some embodiments, the one or more processors are shared by one or more components within, and in some cases, beyond the function of NVM controllers 130. In some embodiments, NVM controllers 130 are configured to receive (e.g., via reset module 710, FIG. 7) reset 144 from various components of storage device 120 (e.g., from supervisory module 126 and/or from storage device controller 128). In some embodiments, reset 144-1 and reset 144-m are the same signal.

NVM devices 140, 142 are coupled to NVM controllers 130 through connections that typically convey commands in addition to data, and optionally convey metadata, error correction information and/or other information in addition to data values to be stored in NVM devices 140, 142 and data values read from NVM devices 140, 142. For example, NVM devices 140, 142 can be configured for enterprise storage suitable for applications such as cloud computing, or for caching data stored (or to be stored) in secondary storage, such as hard disk drives. Additionally and/or alternatively, flash memory (e.g., NVM devices 140, 142) can also be configured for relatively smaller-scale applications such as personal flash drives or hard-disk replacements for personal, laptop and tablet computers. Although flash memory devices and flash controllers are used as an example here, in some embodiments storage device 120 includes other non-volatile memory device(s) and corresponding non-volatile memory controller(s).

In some embodiments, storage device 120 includes supervisory module 126 and storage device controller 128. Storage device 120 may include various additional features that have not been illustrated for the sake of brevity and so as not to obscure more pertinent features of the example embodiments disclosed herein, and a different arrangement of features may be possible.

In some embodiments, supervisory module 126 (also sometimes called a data hardening module) includes one or more processing units (also sometimes called CPUs or processors or microprocessors or microcontrollers) configured to execute instructions in one or more programs (e.g., in supervisory module 126). In some embodiments, the one or more processors are shared by one or more components within, and in some cases, beyond the function of supervisory module 126. Supervisory module 126 is coupled to host interface 122, storage device controller 128, and NVM controllers 130 in order to coordinate the operation of these components, including supervising and controlling functions such as power up, power down, data hardening, charging energy storage device(s), data logging, and other aspects of managing functions on storage device 120.

Storage device controller 128 is coupled to host interface 122, supervisory module 126, and NVM controllers 130. In some embodiments, during a write operation, storage device controller 128 receives data from computer system 110 through host interface 122 and during a read operation, storage device controller 128 sends data to computer system 110 through host interface 122. Further, host interface 122 provides additional data, signals, voltages, and/or other information needed for communication between storage device controller 128 and computer system 110. In some embodiments, storage device controller 128 and host interface 122 use a defined interface standard for communication, such as double data rate type three synchronous dynamic random access memory (DDR3). In some embodiments, storage device controller 128 and NVM controllers 130 use a defined interface standard for communication, such as serial advance technology attachment (SATA). In some other embodiments, the device interface used by storage device controller 128 to communicate with NVM controllers 130 is SAS (serial attached SCSI), or other storage interface. In some embodiments, storage device controller 128 is configured to receive reset 143 from various components of storage device 120 (e.g., from supervisory module 126 and/or from host interface 122). In some embodiments, reset 143, reset 144-1, and reset 144-m are the same signal. In some embodiments, reset 143, reset 144-1, and reset 144-m are independent signals. In some embodiments, reset 143, reset 144-1, and reset 144-m are transmitted via the same communication bus. In some embodiments, reset 143, reset 144-1, and reset 144-m are controlled separately. In some embodiments, storage device controller 128 includes one or more processing units (also sometimes called CPUs or processors or microprocessors or microcontrollers) configured to execute instructions in one or more programs (e.g., in storage device controller 128). In some embodiments, the one or more processors are shared by one or more components within, and in some cases, beyond the function of storage device controller 128.

Figure 2:
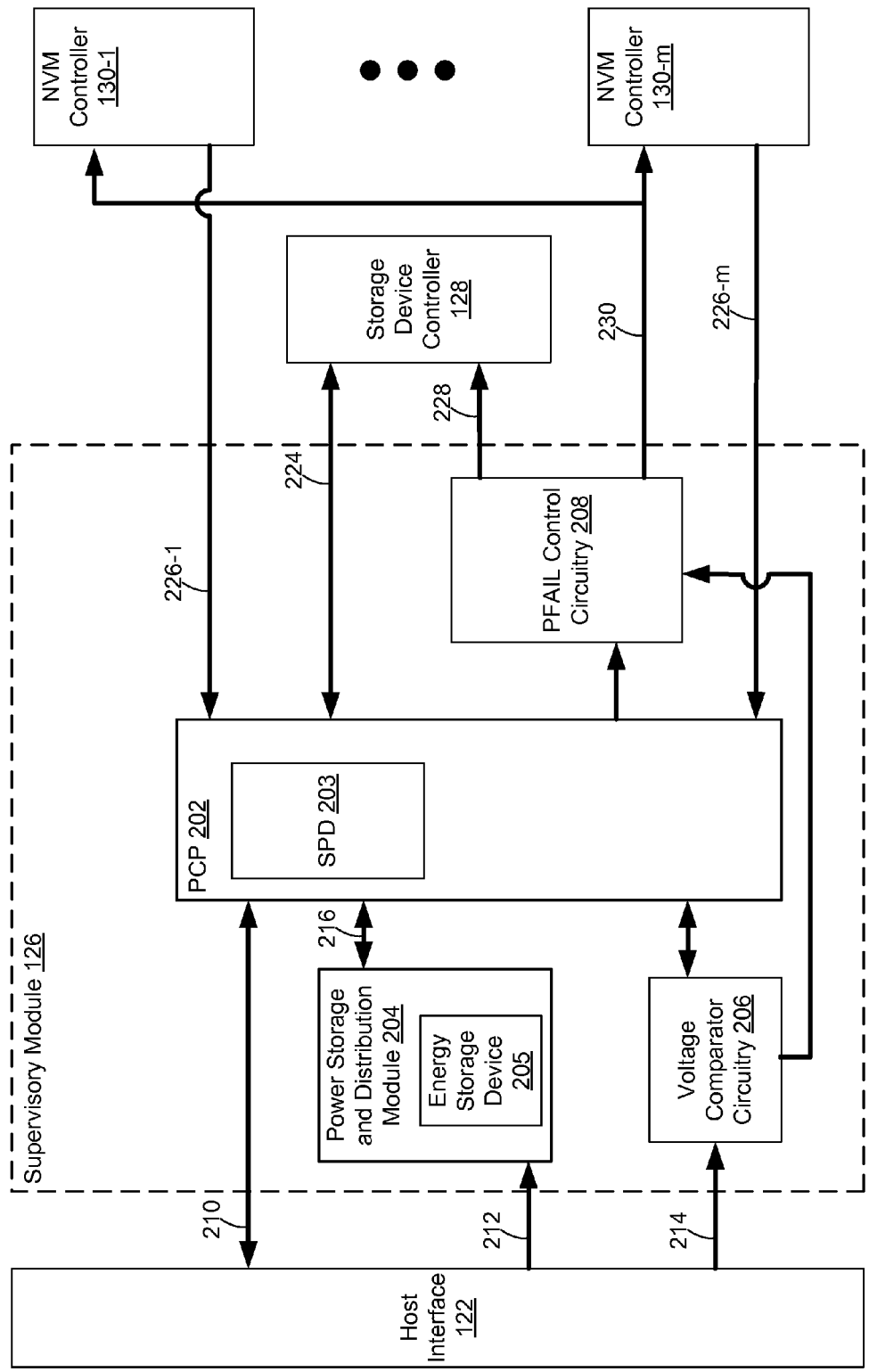
FIG. 2 is a block diagram illustrating an implementation of a supervisory module, in accordance with some embodiments.

FIG. 2 is a block diagram illustrating an implementation of supervisory module 126 (of storage device 120, as shown in FIG. 1), in accordance with some embodiments. Supervisory module 126 is coupled to host interface 122 via communication bus 210, voltage input 212 (e.g., $V_{in}$ 302, FIG. 3A) and voltage input 214 (e.g., $V_{SPD}$ 324, FIG. 3A). In some embodiments, voltage input 212 is a part of a communication bus. In some embodiments, voltage input 212 is the same as voltage input 214, while in other embodiments voltage input 212 is different from voltage input 214. In some embodiments, communication bus 210 includes a voltage source (e.g., $V_{SPD}$ 324, FIG. 3A) supplied through host interface 122.

Communication buses (e.g., communication bus 210, FIG. 2) optionally include circuitry (sometimes called a chipset) that interconnects and controls communications between system components. Supervisory module 126 is coupled to host interface 122, storage device controller 128, and NVM controllers 130 (e.g., NVM controllers 130-1 through 130-m) via communication buses (e.g., communication bus 148, FIG. 1).

Supervisory module 126 includes power control processor (PCP) 202 (including serial presence detect (SPD) 203) for executing modules, programs and/or instructions stored therein. In some embodiments, PCP 202 is coupled to NVM controllers 130 (e.g., NVM controllers 130-1 through 130-m) via PFAIL lines 226. In some embodiments, PFAIL lines 226 are part of a communication bus. In some embodiments, PFAIL lines 226 are tri-state lines that are driven by PCP 202, NVM controllers 130, or neither, depending on the operations of supervisory module 126. PCP 202 is coupled to storage device controller 128 via communication bus 224. In some embodiments, communication bus 224 includes a power test command and/or signal to notify storage device controller 128 of pending power fail operations affecting one or more NVM controllers 130.

Supervisory module 126 also includes power storage and distribution module 204 (including energy storage device 205), power failure (PFAIL) control module 208, voltage comparator circuitry 206, and a plurality of communication buses (e.g., communication buses 210, 216, 222, and 224). In some embodiments, power storage and distribution module 204 includes circuitry for monitoring, storing, and distributing power for a storage device (e.g., storage device 120, FIG. 1), including monitoring, controlling, charging, and/or testing energy storage device 205. In some embodiments, energy storage device 205 includes one or more capacitors. In other embodiments, energy storage device 205 includes one or more inductors or any other passive elements that store energy. In some embodiments, energy storage device 205 is charged by boosting voltage input 212.

Voltage comparator circuitry 206 is coupled to PCP 202 and PFAIL control module 208. In some embodiments, voltage comparator circuitry 206 includes circuitry for monitoring voltage input 214, detecting undervoltage and overvoltage conditions, and signaling power failure conditions to various components (e.g., PFAIL control module 208) of supervisory module 126. While voltage comparator circuitry 206 is shown in FIG. 2 as being external to PCP 202, in some embodiments voltage comparator circuitry 206, or portions of voltage comparator circuitry 206, are embedded in PCP 202. Alternatively, in some embodiments, PCP 202 includes analog to digital conversion (ADC) circuitry, for converting voltage input 214 to a digital value, and comparison circuitry or software for detecting undervoltage and overvoltage conditions.

PFAIL control module 208 is coupled to PCP 202, voltage comparator circuitry 206, storage device controller 128, and NVM controllers 130 (e.g., NVM controllers 130-1 through 130-$m$). In some embodiments, PFAIL control module 208 includes circuitry to detect power fail conditions, signal power failures to storage device controller 128 via PFAIL line 228, and signal power failures to NVM controllers (e.g., NVM controllers 130-1 through 130-$m$) via PFAIL lines 230. In some embodiments, PFAIL lines 230 are part of a communication bus between PFAIL control module 208 and NVM controllers 130.

SPD device 203 is coupled to host interface 122. In some embodiments, SPD 203 is a part of (e.g., integrated into) PCP 202, while in some other embodiments, SPD 203 is separate and distinct from PCP 202. Serial presence detect (SPD) refers to a standardized way to automatically access information about a computer memory module (e.g., storage device 120). For example, information about the type of the device (e.g., where the device type is one of a predefined set of device types), and the storage capacity of the device can be communicated with a host system (e.g., computer system 110) through SPD device 203. In another example, if the memory module has a failure, the failure can be communicated with a host system (e.g., computer system 110) through SPD device 203.

Figure 3A:
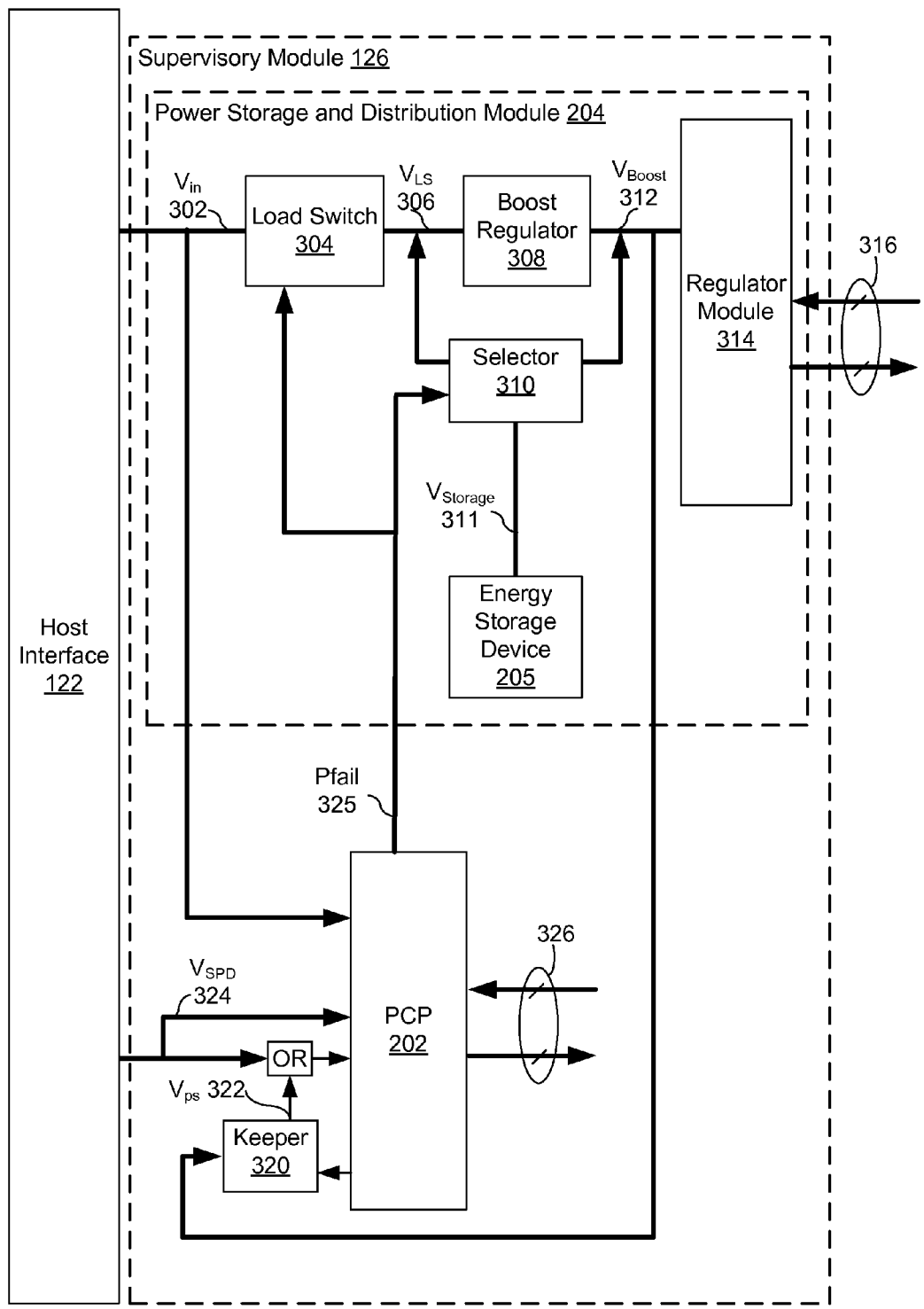
FIG. 3A is a block diagram illustrating an implementation of a power storage and distribution module, in accordance with some embodiments.

FIG. 3A is a block diagram illustrating an implementation of power storage and distribution module 204 and supervisory module 126, in accordance with some embodiments. While some example features are illustrated, various other features have not been illustrated for the sake of brevity and so as not to obscure more pertinent aspects of the example embodiments disclosed herein. To that end, as a non-limiting example, power storage and distribution module 204 includes load switch 304, boost regulator 308, selector 310, energy storage device 205, regulator module 314, and voltages $V_{in}$ 302, $V_{LS}$ 306, $V_{storage}$ 311, and $V_{Boost}$ 312.

Regulator module 314 comprises one or more regulators (also sometimes called power control systems or power regulators) used to power various components of storage device 120 (e.g., storage device controller 128, NVM controllers 130, NVMs 140, and/or NVM 142) via one or more connections 316. In some embodiments, regulator module 314 supplies power to a plurality of controllers coupled to power storage and distribution module 204 and to non-volatile memory associated with each controller. In some embodiments, regulator module 314 comprises a plurality of buck regulators and a plurality of low dropout (LDO) regulators. In some embodiments, $V_{Boost}$ 312 is provided to regulator module 314, which converts $V_{Boost}$ 312 to the voltages required by various components of storage device 120 (e.g., 0.9 volts, 1.35 volts, 1.5 volts, 1.8 volts, and/or 2.5 volts) and provide those voltages to the appropriate components. In some embodiments, regulator module 314 is a component of power storage and distribution module 204. In some embodiments, regulator module 314 is a component of supervisory module 126. Alternatively, in some embodiments, regulator module 314, or portions thereof, are external to supervisory module 126.

In some embodiments, $V_{in}$ 302 is a voltage supplied by a host system (e.g., computer system 110, FIG. 1) and has a target value of 5 volts or less. In some embodiments, $V_{Boost}$ 312 is a boosted voltage, boosted from $V_{in}$ 302, and has a target value of 5.5 volts. In some embodiments, $V_{Boost}$ 312 is used to charge energy storage device 205. In some embodiments, $V_{SPD}$ 324 is a voltage supplied for serial presence detect (SPD) functionality and has a target value of 3.3 volts. In some embodiments, selector 310 comprises a switch (e.g., a transistor). In some embodiments, selector 310 is configured to couple energy storage device 205 to the output of boost regulator 308 during normal operation so as to charge energy storage device 205.

In some embodiments, selector 310 is further configured to couple energy storage device 205 to the input of boost regulator 308 in response to receiving a power fail signal from PCP 202 (e.g., Pfail signal 325). By coupling energy storage device 205 to the input of boost regulator 308 during performance of at least a portion of the power fail operation, a larger portion of the energy stored in energy storage device 205 can be utilized to enable performance of the power fail operation than if the energy storage device 205 were coupled to the output of boost regulator 308. For example, with energy storage device 205 coupled to the output of boost regulator 308, the lowest useful output voltage from energy storage device 205 during a power fail operation might be a first voltage, such as 3 volts, but with energy storage device 205 coupled to the input of boost regulator 308 during at least a portion of the power fail operation, the lowest useful output voltage from energy storage device 205 during the power fail operation might be a second voltage, such as 2 volts or even 1 volt, which is lower than the first voltage.

As a result, a smaller size energy storage device 205 can be used to support a given power fail operation than would have been the case if the energy storage device 205 were coupled to the output of boost regulator 308 during performance of the power fail operation.

In some embodiments, selector 310 is configured to decouple energy storage device 205 from both the input and output of boost regulator 308. For example, in some embodiments, removing power from a component of storage device 120 (e.g., storage device controller 128 and/or NVM controllers 130) includes decoupling energy storage device 205 from both the input and output of boost regulator 308. In some embodiments, energy storage device 205 comprises a power holdup circuit, implemented using one or more capacitors. In some embodiments, energy storage device 205 stores, immediately prior to a power fail condition being detected, at least approximately 30 to 70 millijoules of energy per NVM controller 130 in storage device 120.

In some embodiments, PCP 202 monitors and manages the functionality in power storage and distribution module 204. For example, PCP 202 monitors voltages $V_{in}$ 302 and $V_{SPD}$ 324. In some embodiments, if either $V_{in}$ 302 or $V_{SPD}$ 324 falls below corresponding under-voltage thresholds, PCP 202 signals a power fail condition to PFAIL control circuitry (e.g., PFAIL control module 208, FIG. 2). In some embodiments, PCP 202 signals the power fail condition to a plurality of controllers on storage device 120 (e.g., storage device controller 128 and NVM controllers 130, FIG. 1). In some embodiments, the under-voltage threshold varies depending on the target value of the voltage. For example, if the target voltage for $V_{in}$ 302 is 1.5 volts, the under-voltage threshold may be 1.5 volts minus 5% (i.e., 1.425 volts), so PCP 202 would signal a power fail condition if $V_{in}$ 302 is lower than 1.425 volts. In some embodiments, the under-voltage threshold for $V_{in}$ 302 is different than the under-voltage threshold for $V_{SPD}$ 324.

In some embodiments, during regular operation of storage device 120, $V_{in}$ 302 is used to supply power to storage device 120. However, during a power fail operation or a soft power fail operation, energy storage device 205 is used to provide power to storage device 120. In some embodiments, PCP 202 controls load switch 304 and selector 310 such that $V_{storage}$ is used to power storage device 120 during a power fail or soft power fail operation. For example, during regular operation of storage device 120, $V_{in}$ 302 is used to supply power to storage device 120, so load switch 304 is turned on (e.g., to complete the connection between $V_{in}$ 302 and $V_{LS}$ 306). However, during a power fail operation or a soft power fail operation, energy storage device 205 is used to provide power to storage device 120, so load switch 304 is turned off (e.g., to disable the connection between $V_{in}$ 302 and $V_{LS}$ 306) and selector 310 is configured to couple energy storage device 205 to the input of boost regulator 308 (e.g., to enable the connection between $V_{storage}$ 311 and $V_{LS}$ 306). Any energy storage device, including one or more capacitors, one or more inductors, or one or more other passive elements that store energy, may be used to store energy to be used during a power fail operation or a soft power fail operation.

In some embodiments, energy storage device 205 is charged using $V_{Boost}$ 312, a voltage higher than $V_{LS}$ 306. In some embodiments, boost regulator 308 is controlled and enabled by PCP 202. Further, in some embodiments, $V_{Boost}$ 312 is used as an input to keeper circuitry 320, which along with $V_{SPD}$ 324 provides power to PCP 202. During a power fail operation or a soft power fail operation, $V_{Boost}$ 312 is provided via keeper circuitry 320 to PCP 202 so as to provide power to PCP 202. In some embodiments, PCP 202 has one or more connections 326 used to monitor and control other functions within storage device 120. In some embodiments, $V_{SPD}$ 324 provides power to keeper circuitry 320. Furthermore, in some instances, $V_{SPD}$ 324 is provided to storage device 120 before $V_{in}$ 302 is provided to storage device 120, allowing devices in storage device 120 to operate before main power $V_{in}$ 302 is provided to storage device 120. In some implementation, keeper circuitry 320 provides $V_{ps}$ 322 to PCP 202.

In some embodiments, supervisory module 126 (e.g., PCP 202) uses an algorithm to selectively test one or more capacitors from energy storage device 205 during operation of the storage device. In some embodiments, one or more capacitors from energy storage device 205 are tested during regular operation of the storage device (as opposed to during a power fail operation). Since testing the capacitor(s) will discharge the capacitor(s), supervisory module 126 manages the coordination of testing the capacitor(s) to ensure that testing of the capacitor(s) from energy storage device 205 does not interfere with other operations. In some embodiments, an energy storage device module (e.g., energy storage device module 510, FIG. 5) is used to selectively test one or more capacitors from the energy storage device during operation of the storage device, as described below with respect to FIG. 5.

In some embodiments, testing energy storage device 205 includes charging the energy storage device using a higher voltage than the power supply voltage provided to the storage device and determining whether energy storage device 205 meets a predefined minimum charge level threshold (sometimes called the minimum charge level threshold) within a predefined charge time. For example, if the predefined minimum charge level threshold is 95% charge capacity and the predefined charge time is 25 ms, the storage device determines whether the energy storage device is charged to at least 95% charge capacity within 25 ms. In some embodiments, an energy storage device module (e.g., energy storage device module 510, FIG. 5) is used to determine whether energy storage device 205 meets a predefined minimum charge level threshold within a predefined charge time, as described below with respect to FIG. 5. Further, in accordance with a determination that energy storage device 205 does not meet the predefined minimum charge level threshold in the predefined charge time, the storage device prevents operation of the storage device. In some embodiments, a determination that energy storage device 205 does not meet the predefined minimum charge level threshold in the predefined charge time indicates that there will be a data hardening failure when a power fail operation is performed in the future (e.g., a predictive failure detection). As a result, operation of the storage device is prevented to avoid a future data hardening failure. In some embodiments, preventing operation of the storage device includes communicating a failure message to a host system (e.g., computer system 110, FIG. 1). In some embodiments, the failure message is communicated with the host system through a SPD device (e.g., SPD device 203, FIG. 2) or a SPD bus controller.

Figure 3B:
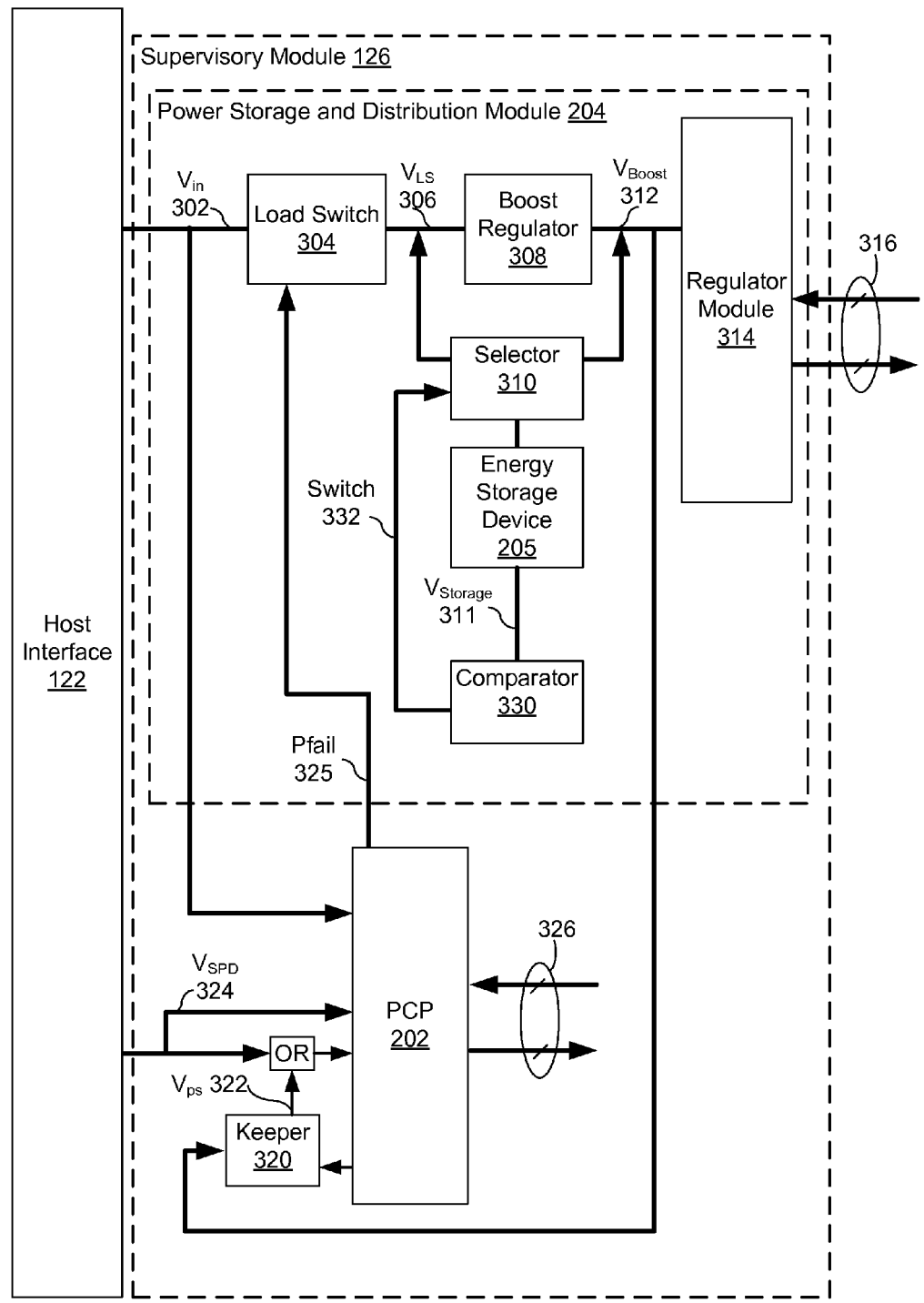
FIG. 3B is a block diagram illustrating another implementation of a power storage and distribution module, in accordance with some embodiments.

FIG. 3B is another block diagram illustrating an implementation of power storage and distribution module 204 and supervisory module 126, in accordance with some embodiments. While some example features are illustrated, various other features have not been illustrated for the sake of brevity and so as not to obscure more pertinent aspects of the example embodiments disclosed herein. To that end, as a non-limiting example, FIG. 3B shows power storage and distribution module 204 further including comparator 330. Comparator 330 is configured to determine whether an output of energy storage device 205 (e.g., $V_{storage}$ 311) falls below a predetermined voltage threshold and, in accordance with a determination that the output of energy storage device 205 has fallen below the predetermined threshold, signal selector 310 (e.g., via switch signal 332). In some embodiments, the predetermined voltage threshold is determined based on a minimum operating voltage of regulator module 314. In some embodiments, the predetermined voltage threshold is based on an optimal operating voltage of regulator 314.

As a non-limiting example, during normal operation of storage device 120, energy storage device 205 is coupled, via selector 310, to the output of boost regulator 308 (e.g., such that $V_{storage}$ is connected to $V_{Boost}$). In this example, in response to detecting a power fail condition, PCP 202 will signal (e.g., via pfail signal 325) load switch 304 to decouple $V_{in}$ 302 from $V_{LS}$ 306. In this example, energy storage device 205 is coupled to the output of boost regulator 308 and provides power to regulator module 314 until comparator 330 determines that $V_{storage}$ 311 has dropped below the predetermined threshold; at which time, comparator 330 signals (e.g., via switch signal 332) to selector 310 to selectively couple energy storage device 205 to the input of boost regulator 308. Once energy storage device 205 is selectively coupled to the input of boost regulator 308 (e.g., such that $V_{storage}$ 311 is connected to $V_{LS}$ 306) $V_{storage}$ 311 is boosted by boost regulator 308 and continues to supply power to regulator module 314 until the power fail operations are complete or $V_{Boost}$ 312 falls below a predetermined minimum operating threshold. See discussion of operations 820 and 822 in method 800, below. In some embodiments, by delaying the switchover by selector 310 until $V_{storage}$ 311 has dropped below the predetermined threshold, regulators in regulator module 314 are operated more efficiently than if the selector 310 were to couple energy storage device 205 to the input of boost regulator 308 immediately upon detection of the power fail condition.

Figure 4:
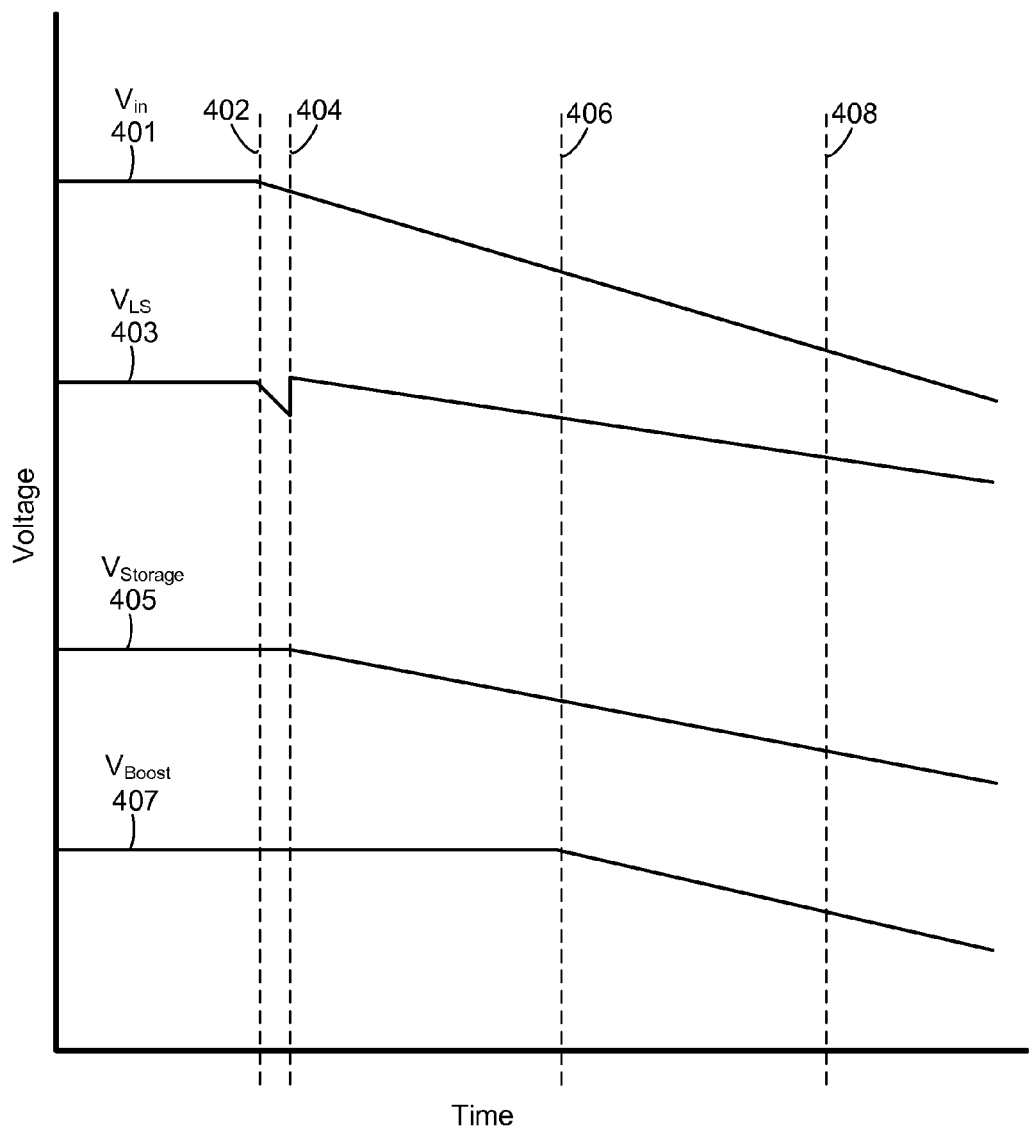
FIG. 4 is a voltage diagram corresponding to a power fail event, in accordance with some embodiments.

FIG. 4 is a voltage diagram corresponding to a power fail event, in accordance with some embodiments. At time 402 a drop in the voltage supplied by $V_{in}$ 401 occurs (e.g., a power fail event). In some embodiments, $V_{in}$ 401 is $V_{in}$ 302. Also at time 402, a drop in $V_{LS}$ 403 (e.g., $V_{LS}$ 306) occurs corresponding to the drop in $V_{in}$ 401. The power failure is detected (e.g., by PCP 202) and, at time 404, the energy storage device (e.g., energy storage device 205) is coupled to the input of the boost regulator (e.g., boost regulator 308). In some embodiments, the PCP detects the power failure and signals the load switch (e.g., load switch 304) via a pfail signal (e.g., pfail signal 325) to decouple $V_{LS}$ 403 from $V_{in}$ 401. In some embodiments, the PCP also signals the selector (e.g., selector 310) via a pfail signal (e.g., pfail signal 325) to couple the energy storage device to the input of the boost regulator (e.g., such that $V_{storage}$ 405 is connected to $V_{LS}$ 403). At time 406 the voltage supplied by $V_{storage}$ 405 has dropped below a minimum voltage threshold required by the boost regulator to maintain the optimal voltage output. Thus, at time 406, the voltage supplied by $V_{Boost}$ 407 begins to drop. At time 408, the voltage supplied by $V_{Boost}$ 407 drops below a minimum voltage threshold required by a regulator module (e.g., regulator module 314) to supply useable power to a corresponding portion of the storage device (e.g., storage device 120).

Figure 5:
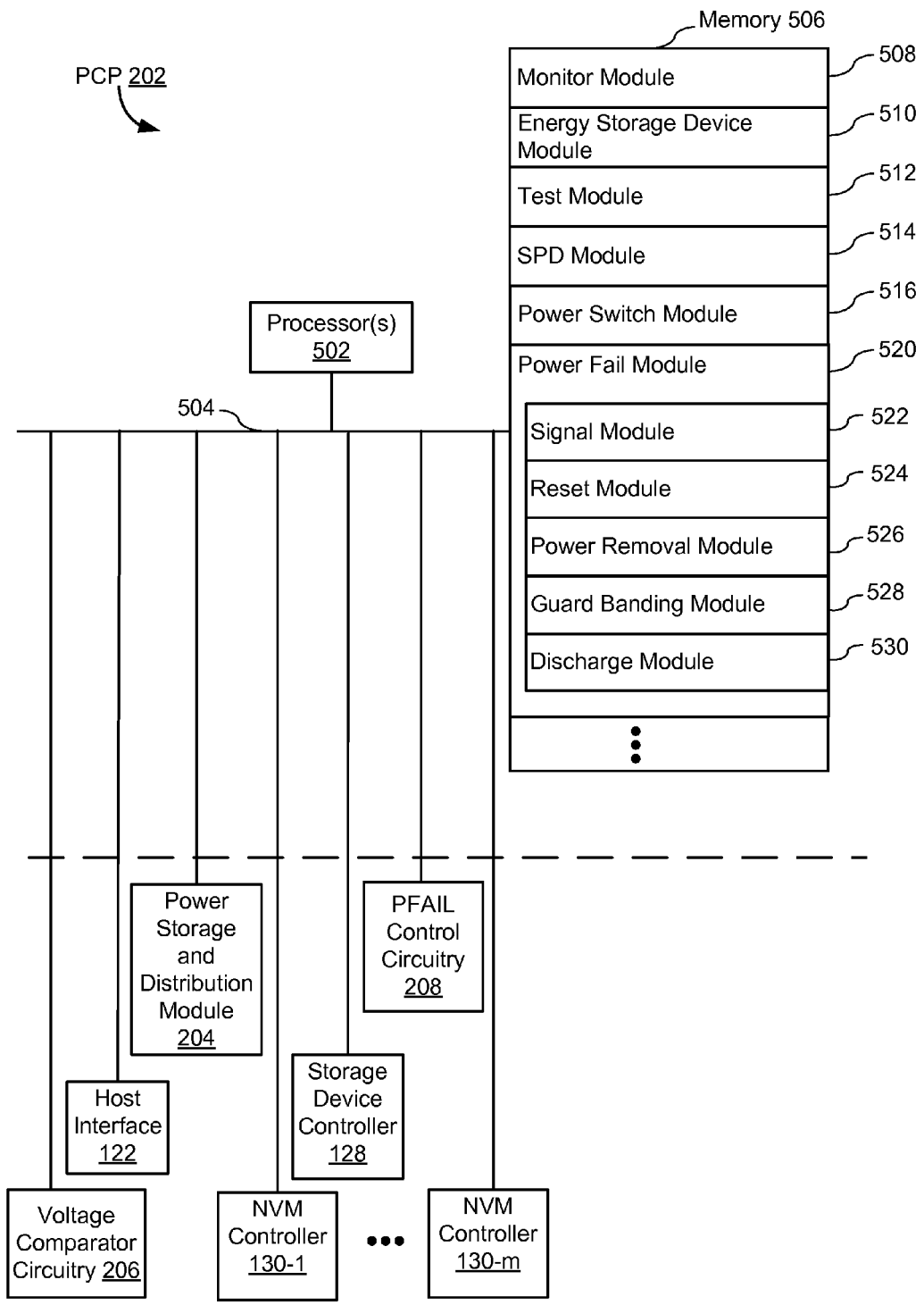
FIG. 5 is a block diagram illustrating an implementation of a power control processor (PCP), in accordance with some embodiments.

FIG. 5 is a block diagram illustrating an implementation of PCP 202, in accordance with some embodiments. PCP 202 includes one or more processors (also sometimes called CPUs or processing units or microprocessors or microcontrollers) 502 for executing modules, programs and/or instructions stored in memory 506 and thereby performing processing operations, memory 506, and one or more communication buses 504 for interconnecting these components. Communication buses 504 optionally include circuitry (sometimes called a chipset) that interconnects and controls communications between system components. PCP 202 is coupled to host interface 122, storage device controller 128, NVM controllers 130 (e.g., NVM controllers 130-1 through 130-m), power storage and distribution module 204, voltage comparator circuitry 206, and PFAIL control module 208 by communication buses 508. Memory 506 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 506 optionally includes one or more storage devices remotely located from processor(s) 502. Memory 506, or alternately the non-volatile memory device(s) within memory 506, comprises a non-transitory computer readable storage medium. In some embodiments, memory 506, or the computer readable storage medium of memory 506 stores the following programs, modules, and data structures, or a subset thereof:

- monitor module 508 that is used for monitoring signals provided to a storage device (e.g., storage device 120, FIG. 1), for example to monitor and determine whether a power supply voltage provided to the storage device is lower than an under-voltage threshold;
- energy storage device module 510 that is used for monitoring, controlling, charging, and/or testing an energy storage device (e.g., energy storage device 205) on the storage device;
- test module 512 that is used for testing one or more functions of the storage device;
- SPD module 514 for accessing information about a computer memory module and/or communicating with a host system;
- power switch module 516 that is used for determining and controlling the voltage that is used to supply power to the storage device; and
- power fail module 520 that is used for performing a power fail operation or a soft power fail operation in response to certain criterion or signals.

In some embodiments, memory 506, or the computer readable storage medium of memory 506 further stores a configuration module for configuring storage device 120 and supervisory module 126, and/or configuration values (such as one or more under-voltage threshold values) for configuring supervisory module 126, neither of which is explicitly shown in FIG. 5. In some embodiments, upon power up and upon reset, the configuration module automatically sets the values of one or more configuration parameters of storage device 120 (and, optionally, determines which of two or more power fail modules, test modules, etc. to use) in accordance with the components of storage device 120 (e.g., the type of non-volatile memory components in storage device 120) and/or characteristics of the data storage system 100 that includes storage device 120.

In some embodiments, power fail module 520 includes the following modules or sub-modules, or a subset thereof:
- signal module 522 that is used for signaling a power fail condition to a plurality of controllers on the storage device (e.g., storage device controller 128 and NVM controllers 130, FIG. 1);
- reset module 524 that is used for resetting one or more controllers (e.g., storage device controller 128, and/or one or more of NVM controllers 130) of the storage device;
- power removal module 526 that is used for removing power from one or more controllers (e.g., storage device controller 128, and/or one or more of NVM controller 130) of the storage device;
- guard banding module 528 that is used for tolerating power fluctuations in a power supply voltage provided to the storage device; and discharge module 530 that is used for discharging an energy storage device (e.g., energy storage device 205, FIG. 2) on the storage device.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 506 may store a subset of the modules and data structures identified above. Furthermore, memory 506 may store additional modules and data structures not described above. In some embodiments, the programs, modules, and data structures stored in memory 506, or the computer readable storage medium of memory 506, provide instructions for implementing respective operations in the methods described below with reference to FIGS. 8A-8B.

Although FIG. 5 shows PCP 202, FIG. 5 is intended more as a functional description of the various features which may be present in a PCP than as a structural schematic of the embodiments described herein. In practice, and as recognized by those of ordinary skill in the art, items shown separately could be combined and some items could be separated.

Figure 6:
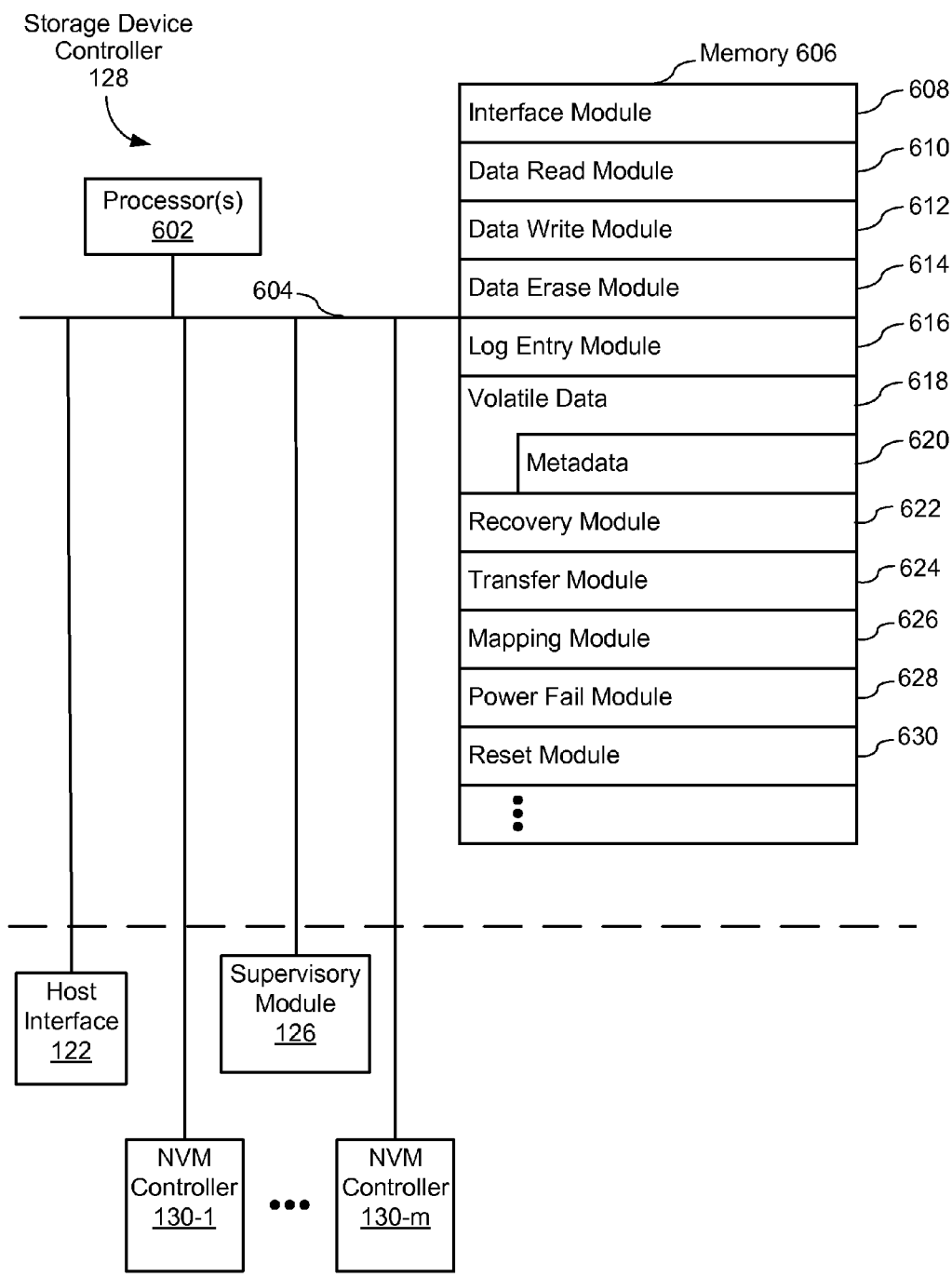
FIG. 6 is a block diagram illustrating an implementation of a storage device controller, in accordance with some embodiments.

FIG. 6 is a block diagram illustrating an implementation of storage device controller 128, in accordance with some embodiments. Storage device controller 128 typically includes: one or more processors (also sometimes called CPUs or processing units or microprocessors or microcontrollers) 602 for executing modules, programs and/or instructions stored in memory 606 and thereby performing processing operations; memory 606; and one or more communication buses 604 for interconnecting these components. One or more communication buses 604, optionally, include circuitry (sometimes called a chipset) that interconnects and controls communications between system components. Storage device controller 128 is operatively coupled to host interface 122, supervisory module 126, and NVM controllers 130 (e.g., NVM controllers 130-1 through 130-*m*) by communication buses 604. Memory 606 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. In some embodiments, the information stored in memory 606 includes volatile data 618 corresponding to portions of non-volatile memory within data storage system 100 (e.g., NVMs 140 and/or NVMs 142, FIG. 1). In some embodiments, the information stored in memory 606 comprises metadata 620 (e.g., metadata comprising age category, known-bad portion, etc.) corresponding to portions of the non-volatile memory. Memory 606, optionally, includes one or more storage devices remotely located from the one or more CPUs 602. Memory 606, or alternatively the non-volatile memory device(s) within memory 606, comprises a non-transitory computer readable storage medium. In some embodiments, memory 606, or the non-transitory computer readable storage medium of memory 606, stores the following programs, modules, and data structures, or a subset or superset thereof:

interface module 608 that is used for communicating with other components, such as host interface 122, supervisory module 126, and NVM controllers 130;

data read module 610 for performing a read operation to read data from non-volatile memory (e.g., a persistent data store including non-volatile memory such as flash memory) according to a read command from computer system 110;

data write module 612 for performing a write operation to write data (e.g., a record including write data and a log entry) to non-volatile memory according to a write command from computer system 110;

data erase module 614 for performing an erase operation to erase data from non-volatile, according to an erase command from computer system 110 and/or according to a garbage collection erase command (generated internally by storage device controller 128, or externally to storage device controller 128);

log entry module 616 for generating a log entry associated with respective data;

recovery module 622 for performing a recovery process, or causing a recovery process to be performed, in response to detecting an error condition or synchronization command;

transfer module 624 that is used for transferring data held in volatile memory to non-volatile memory;

mapping module 626, which maps logical addresses in a logical address space (e.g., a logical address space of a host or client system) to physical addresses in a physical address space (e.g., a physical address space of storage device 120) for respective portions of the non-volatile memory within data storage system 100, and optionally maps physical addresses for respective portions of the non-volatile memory to logical addresses. In some embodiments, mappings module 626 excludes known-bad portions of the non-volatile memory from the maps;

power fail module 628 that is used for performing a power fail operation or a soft power fail operation; and reset module 630 that is used for resetting storage device controller 128.

In some embodiments, power fail module 628 optionally includes a transfer sub-module that is used for transferring data held in volatile memory to non-volatile memory during a power fail operation. In some embodiments, transfer module 624 is used to transfer data held in volatile memory to non-volatile memory during a power fail operation.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 606 may store a subset of the modules and data structures identified above. Furthermore, memory 606 may store additional modules and data structures not described above. In some embodiments, the programs, modules, and data structures stored in memory 606, or the computer readable storage medium of memory 606, provide instructions for implementing respective operations in the methods described below with reference to FIGS. 8A-8B.

Figure 7:
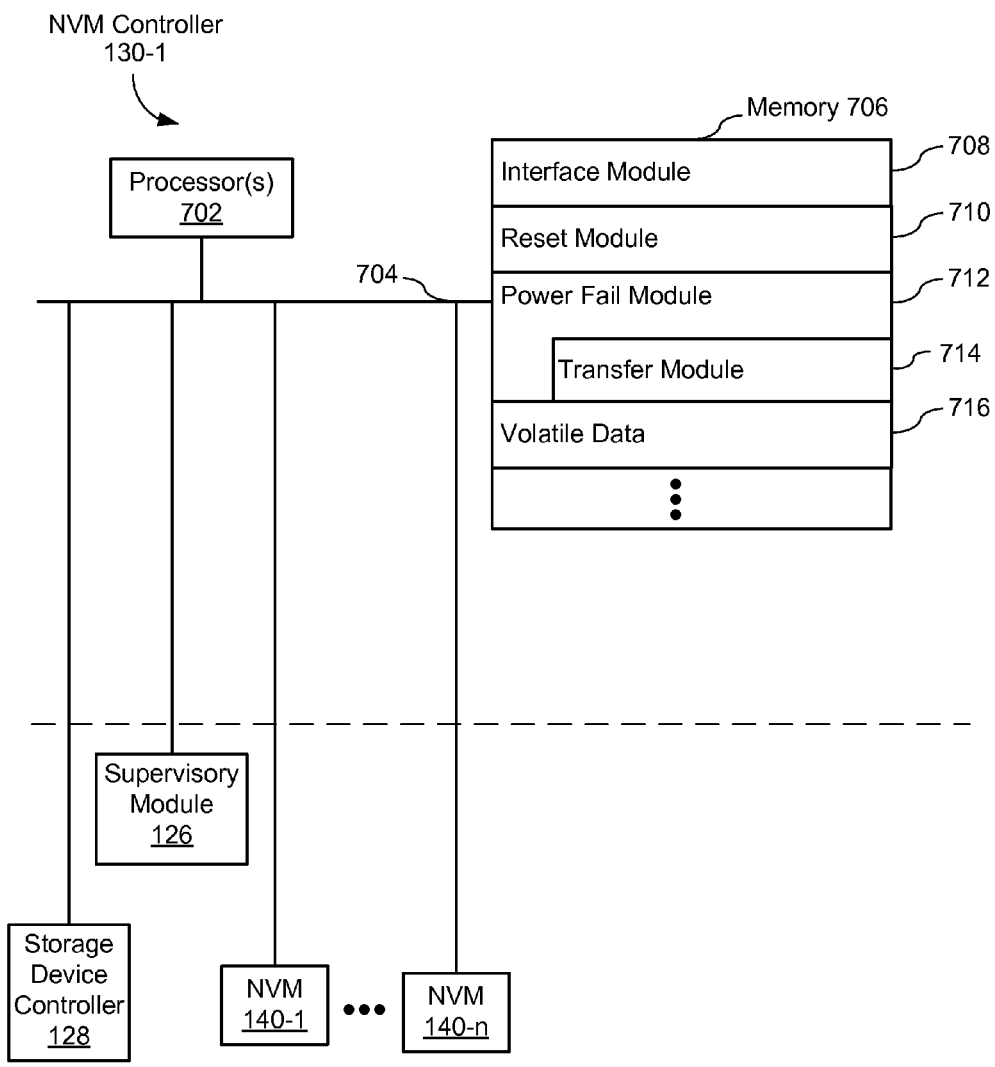
FIG. 7 is a block diagram illustrating an implementation of a non-volatile memory (NVM) controller, in accordance with some embodiments.

Although FIG. 6 shows a storage device controller 128, FIG. 6 is intended more as a functional description of the various features which may be present in a memory controller than as a structural schematic of the embodiments described herein. In practice, and as recognized by those of ordinary skill in the art, items shown separately could be combined and some items could be separated.

FIG. 7 is a block diagram illustrating an implementation of NVM controller 130-1, such as a flash controller, in accordance with some embodiments. NVM controller 130-1 typically includes one or more processors (also sometimes called CPUs or processing units or microprocessors or microcontrollers) 702 for executing modules, programs and/or instructions stored in memory 706 and thereby performing processing operations, memory 706, and one or more communication buses 704 for interconnecting these components. Communication buses 704 optionally include circuitry (sometimes called a chipset) that interconnects and controls communications between system components. NVM controller 130-1 is coupled to storage device controller 128, supervisory module 126, and NVM devices 140 (e.g., NVM devices 140-1 through 140-n, such as flash memory devices) by communication buses 704. Memory 706 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. In some embodiments, memory 706 includes volatile data 716 corresponding to portions of non-volatile memory within data storage system 100 (e.g., NVMs 140 and/or NVMs 142, FIG. 1). Memory 706 optionally includes one or more storage devices remotely located from processor(s) 702. Memory 706, or alternately the non-volatile memory device(s) within memory 706, comprises a non-transitory computer readable storage medium. In some embodiments, memory 706, or the computer readable storage medium of memory 706 stores the following programs, modules, and data structures, or a subset thereof:

- interface module 708 that is used for communicating with other components, such as storage device controller 128, supervisory module 126, and NVM devices 140;
- reset module 710 that is used for resetting NVM controller 130-1; and
- power fail module 712 that is used for performing a power fail operation or a soft power fail operation.

In some embodiments, power fail module 712 optionally includes transfer submodule 714 that is used for transferring data held in volatile memory to non-volatile memory during a power fail operation.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 706 may store a subset of the modules and data structures identified above. Furthermore, memory 706 may store additional modules and data structures not described above. In some embodiments, the programs, modules, and data structures stored in memory 706, or the computer readable storage medium of memory 706, provide instructions for implementing respective operations in the methods described below with reference to FIGS. 8A-8B.

Although FIG. 7 shows a NVM controller 130-1, FIG. 7 is intended more as a functional description of the various features which may be present in a NVM controller than as a structural schematic of the embodiments described herein. In practice, and as recognized by those of ordinary skill in the art, items shown separately could be combined and some items could be separated. Further, although FIG. 7 shows a NVM controller 130-1, the description of FIG. 7 similarly applies to other NVM controllers (e.g., NVM controllers 130-2 through 130-m) in storage device 120 (FIG. 1).

Figure 8A:
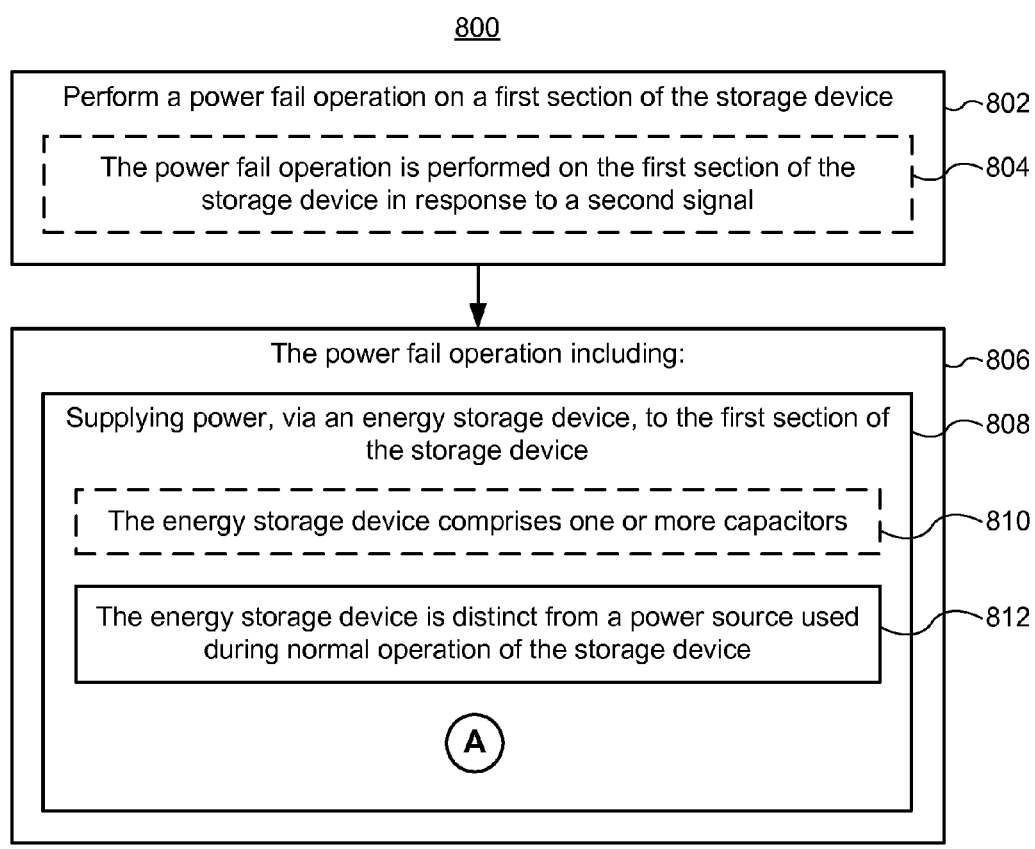
FIGS. 8A-8B illustrate a flowchart representation of a method of power management in a storage device, in accordance with some embodiments.
Figure 8B:
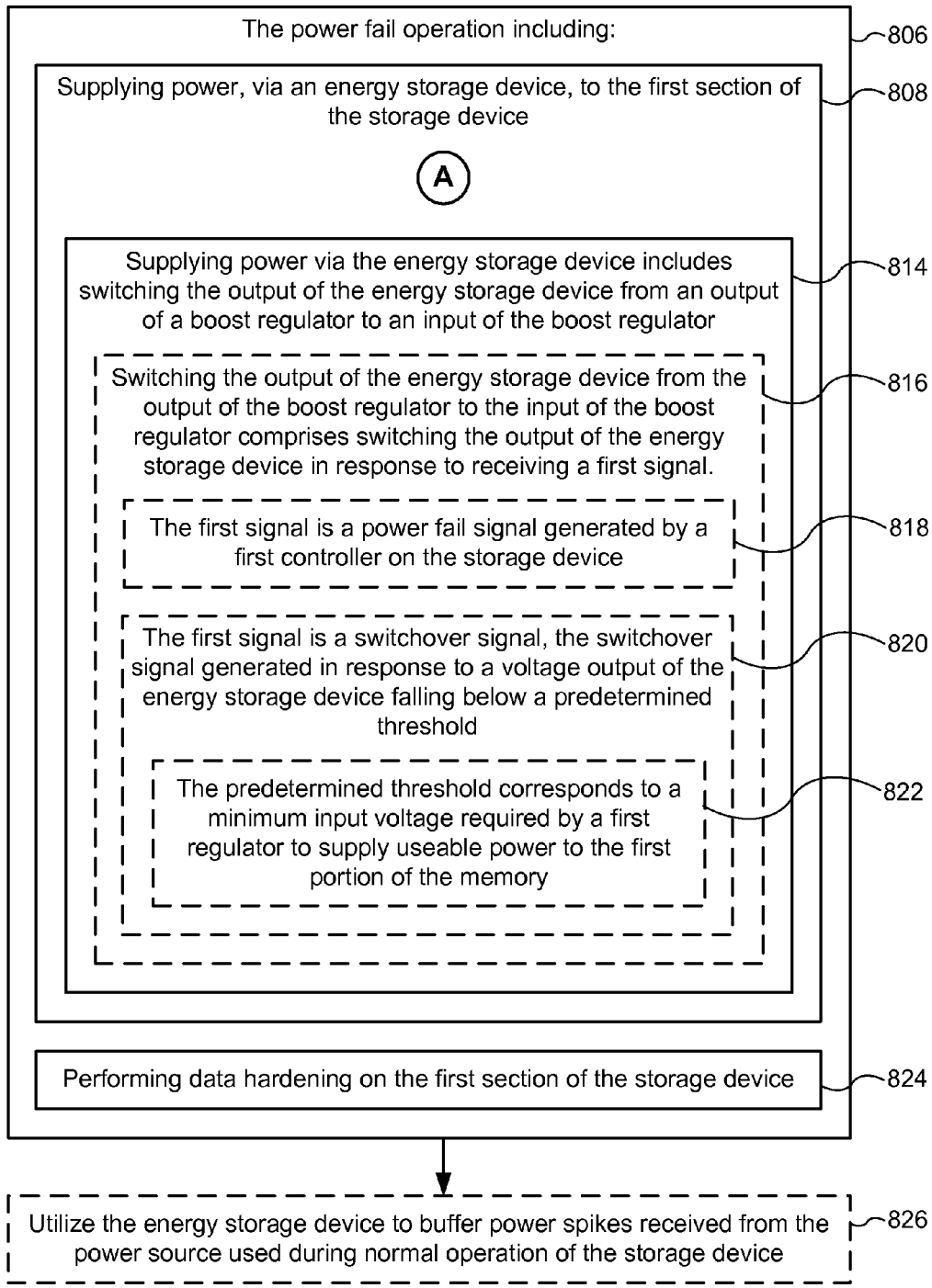

FIGS. 8A-8B illustrate a flowchart representation of method 800 of power management in a storage device, in accordance with some embodiments. In some embodiments, the storage device comprises a solid-state drive implemented as a dual in-line memory module (DIMM) device. In some embodiments, the storage device is compatible with a DIMM memory slot. For example, in some embodiments, the storage device is compatible with a 240-pin DIMM memory slot using a DDR3 interface specification. In some embodiments, the storage device (e.g., storage device 120, FIG. 1) coordinates and manages multiple sub-system components to manage power and harden data, which initiates performance of method 800. At least in some embodiments, method 800 is performed by a storage device (e.g., storage device 120, FIG. 1) or one or more components of the storage device (e.g., supervisory module 126, storage device controller 128, and/or NVM controllers 130, FIG. 1). In some embodiments, method 800 is governed by instructions that are stored in a non-transitory computer readable storage medium and that are executed by one or more processors of a device, such as the one or more processors 502 of PCP 202, the one or more processors 602 of storage device controller 128, and/or the one or more processors 702 of NVM controllers 130, as shown in FIGS. 5-7.

The storage device performs (802) a power fail operation on a first section of the storage device. In some embodiments, the power fail operation is initiated by a host server (also sometimes called an end system) (e.g., computer system 110, FIG. 1). In some embodiments, the power fail operation is initiated by a supervisory module (e.g., supervisory module 126, FIG. 1) or a component thereof (e.g., PCP 202, FIG. 2). In some embodiments, the first section of the storage device comprises the entire storage device. In some embodiments, the first section of the storage device is the section of the storage device governed by a supervisory module (e.g., supervisory module 126, FIG. 1). In some embodiments, the first section of the storage device is the section of the storage device governed by a particular storage device controller (e.g., storage device controller 128, FIG. 1). In some embodiments, the power fail operation is performed in response to a first voltage dropping below a predetermined voltage threshold and the first section of the storage device is the section of the storage device that utilizes the first voltage or a voltage derived therefrom. In some embodiments, the power fail operation is a simulated power fail operation (also sometimes called a soft power fail operation).

In some embodiments, the power fail operation is performed (804) on the first section of the storage device in response to a second signal. In some embodiments, the second signal corresponds to an input voltage (e.g., $V_{in}$ 302, FIG. 3A) dropping below a predetermined minimum voltage. In some embodiments, the second signal is a power fail signal generated by a controller on the storage device. For example, in some embodiments, the second signal is a power fail signal generated by a PCP (e.g., pfail signal 325 generated by PCP 202 in FIG. 3A). In some embodiments, the second signal is a power fail signal received by the storage device from a device or source external to the storage device. For example, a power fail signal received from computer system 110 in FIG. 1 (e.g., via control line 111).

The power fail operation (806) includes supplying power (808), via an energy storage device, to the first section of the storage device. For example, in accordance with some embodiments, energy storage device 205 in FIG. 3A supplies power to storage device controller 128, NVM controllers 130, and NVMs 140-142 via connections 316.

In some embodiments, the energy storage device comprises one or more capacitors. In some embodiments, the energy storage device includes one or more inductors and/or one or more other passive elements that store energy.

The energy storage device is distinct (812) from a power source used during normal operation of the storage device. For example, in some embodiments, $V_{in}$ 302 in FIG. 3A is a power source used during normal operation of storage device 120. In this example, energy storage device 205 in FIG. 3A is used during a power fail operation and is distinct from $V_{in}$ 302.

As used herein, "normal" operation, also sometimes called "standard" operation, is a mode of operation of the storage device in which the storage system is being used for its intended purposes (e.g., to read and write data) by a host system (e.g., computer system 110, FIG. 1). For example, in normal operation, the storage device is receiving and responding to commands sent from a host system. Normal operation is distinguished from a power fail operation where the storage device is hardening data and/or resetting controllers rather than receiving and responding to commands sent from a host system.

Normal operation is also distinguished from manufacturing of the storage device, which is completed prior to the storage device being coupled to a host system, and testing of the storage device (sometimes called a testing mode of operation), which is either done: (1) while coupled to a testing system; (2) prior to being coupled to a host system; and/or (3) is done in a manner that prevents the storage device from being used for its intended purposes during the testing process. For example, failure detection optionally occurs in a storage device during manufacturing, testing, and/or normal operation. In some embodiments, failure detection during the manufacturing process comprises detecting that the storage device (and/or individual components therein) do not meet manufacturing parameters (e.g., one or more characteristics of the device are outside of predetermined acceptable boundaries). In some embodiments, failure detection during a testing process comprises testing the operability of a plurality of distinct portions on the storage device (e.g., systematically testing each portion of the storage device in a controlled manner). In some embodiments, the testing process includes more controlled parameters (e.g., controlled parameters specified by the testing protocol) than normal operation. For example, during the testing process, write commands optionally involve known predetermined data to be written to each portion, whereas during normal operation, the data is variable and is based in part on the operation of the host system. In some embodiments, manufacturing and testing are a combined process where testing is performed at various stages of the manufacturing.

Supplying power via the energy storage device includes switching (814) the output of the energy storage device from an output of a boost regulator to an input of the boost regulator. For example, in accordance with some embodiments, selector 310 in FIG. 3A switches the output of energy storage device 205 from the output of boost regulator 308 to the input of boost regulator 308 during a power fail operation. In some embodiments, the energy storage device is switched as soon as the power fail event is detected. In some embodiments, however, the energy storage device is switched (from the output of boost regulator 308 to the input of boost regulator 308) when, or in accordance with a determination that, the voltage supplied by the energy storage device (e.g., $V_{storage}$ 311, FIG. 3B) falls below a predetermined threshold.

In some embodiments, switching the output of the energy storage device from the output of the boost regulator to the input of the boost regulator comprises switching (816) the output of the energy storage device in response to receiving a first signal. For example, in accordance with some embodiments, selector 310 in FIG. 3A switches the output of energy storage device 205 from the output of boost regulator 308 to the input of boost regulator 308 in response to a pfail signal (e.g., pfail signal 325). In accordance with some embodiments, selector 310 in FIG. 3B switches the output of energy storage device 205 from the output of boost regulator 308 to the input of boost regulator 308 in response to a switchover signal (e.g., switchover signal 332).

In some embodiments, the first signal is a power fail signal (818) generated by a first controller on the storage device. In some embodiments, the first controller corresponds to the first section of the storage device. In some embodiments, the first controller is a storage device controller (e.g., storage device controller 128, FIG. 1). In some embodiments, the first controller is a component of a supervisory module (e.g., PCP 202, FIG. 2). Alternatively, in some embodiments, the power fail signal is received from a device or source external to the storage device. For example, a power fail signal received from computer system 110 in FIG. 1 (e.g., via control line 111).

In some embodiments, the first signal is a switchover signal (820), the switchover signal generated in response to a voltage output of the energy storage device falling below a predetermined threshold. For example, selector 310 in FIG. 3B switches the output of energy storage device 205 from the output of boost regulator 308 to the input of boost regulator 308 in response to switch signal 332. In some embodiments, the switchover signal is generated by a comparator (e.g., comparator 330, FIG. 3B) coupled to the output of the energy storage device.

In some embodiments, the predetermined threshold corresponds to (822) a minimum input voltage required by a first regulator to supply useable power to the first portion of the memory. In some embodiments, the first regulator is coupled to the output of the boost regulator and is used to supply power to a first portion of the storage device. In some embodiments, a plurality of regulators are coupled to the output of the boost regulator and are used to supply power to a first portion of the storage device and the plurality of regulators include the first regulator. In some embodiments, the first regulator is a component of a regulator module coupled to the output of the boost regulator (e.g., regulator module 314, FIG. 3A). As a non-limiting example, in some embodiments, the first regulator is a buck regulator used to supply a first voltage (e.g., 2.85 volts) from an input voltage (e.g., $V_{Boost}$ 312, FIG. 3A). In this example, the buck regulator is unable to supply the first voltage once the input voltage drops below a minimum input voltage requirement of 3 volts. In some embodiments, the predetermined threshold corresponds to a minimum input voltage required by one or more voltage regulators to operate correctly, where the one or more voltage regulators are coupled to the output of the energy storage device and correspond to the first section of the storage device.

The power fail operation (806) further includes performing (824) data hardening on the first section of the storage device. As used herein, data hardening is the process of saving data to non-volatile memory. The data optionally includes mission critical data and/or metadata. In some embodiments, the storage device (e.g., storage device 120, FIG. 1) comprises volatile memory and non-volatile memory and data hardening comprises transferring data from the volatile memory to the non-volatile memory. In some embodiments, the storage device includes volatile memory corresponding to a first controller (e.g., NVM controller 130-1, FIG. 1) and the first controller performs data hardening by transferring data from the corresponding volatile memory to non-volatile memory (e.g., NVMs 140). For example, in some embodiments, the first section of the memory device corresponds to a plurality of controllers, each controller of the plurality of controllers having associated volatile memory. In this example, performing data hardening on the first section of the storage device comprises transferring data from the associated volatile memory to non-volatile memory.

In some embodiments, in addition to using the energy storage device to provide power during power fail operations, the storage device utilizes (826) the energy storage device to buffer power spikes received from the power source used during normal operation of the storage device.

In some embodiments, the storage device comprises one or more three-dimensional (3D) memory devices and circuitry associated with operation of memory elements in the one or more 3D memory devices.

In some embodiments, the circuitry and one or more memory elements in a respective 3D memory device, of the one or more 3D memory devices, are on the same substrate.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A circuit to protect data in a storage device, the circuit comprising:
    an energy storage device;
    a boost regulator for boosting an input voltage;
    a load switch for selectively coupling a power source to the input of the boost regulator, wherein the load switch is configured to de-couple the power source from the input of the boost regulator in response to receiving a power fail signal;
    a selector for selectively coupling the energy storage device to either an input or an output of the boost regulator;
        wherein the selector is configured to couple the energy storage device to the output of the boost regulator during normal operation of the storage device; and
        wherein the selector is further configured to couple the energy storage device to the input of the boost regulator in response to receiving a first signal; and
    a plurality of regulators coupled to the output of the boost regulator for supplying power to a first portion of the storage device.

2. The circuit of claim 1, wherein the first signal is the power fail signal.

3. The circuit of claim 1, wherein the first signal is a switchover signal, the switchover signal generated in response to a voltage output of the energy storage device falling below a predetermined threshold.

4. The circuit of claim 3, wherein the predetermined threshold corresponds to a minimum input voltage required by at least one regulator in the plurality of regulators to supply useable power to the first portion of the storage device.

5. The circuit of claim 1, further comprising a comparator having an output comprising the first signal.

6. The circuit of claim 1, wherein the energy storage device comprises one or more capacitors.

7. The circuit of claim 1, wherein the first signal corresponds to a power fail operation.

8. The circuit of claim 1, wherein, during normal operation, the energy storage device is used to buffer power spikes.

9. A method of protecting data in a storage device comprising volatile memory and non-volatile memory, the method comprising:
performing a power fail operation on a first section of the storage device, the power fail operation including:
supplying power, via an energy storage device, to the first section of the storage device;
wherein the energy storage device is distinct from a power source used during normal operation of the storage device; and
wherein supplying power via the energy storage device includes switching the output of the energy storage device from an output of a boost regulator to an input of the boost regulator; and
performing data hardening on the first section of the storage device.

10. The method of claim 9, wherein switching the output of the energy storage device from the output of the boost regulator to the input of the boost regulator comprises switching the output of the energy storage device in response to receiving a first signal.

11. The method of claim 10, wherein the first signal is a power fail signal generated by a first controller on the storage device.

12. The method of claim 10, wherein the first signal is a switchover signal, the switchover signal generated in response to a voltage output of the energy storage device falling below a predetermined threshold.

13. The method of claim 12, wherein the predetermined threshold corresponds to a minimum input voltage required by a first regulator to supply useable power to the first portion of the storage device.

14. The method of claim 9, wherein the energy storage device comprises one or more capacitors.

15. The method of claim 9, further comprising utilizing the energy storage device to buffer power spikes received from the power source used during normal operation of the storage device.

16. The method of claim 10, wherein the power fail operation is performed on the first section of the storage device in response to a second signal.

17. A non-transitory computer readable storage medium, storing one or more programs for execution by one or more processors of a storage device, the one or more programs including instructions for:
performing a power fail operation on a first section of the storage device, the power fail operation including:
supplying power, via an energy storage device, to the first section of the storage device;
wherein the energy storage device is distinct from a power source used during normal operation of the storage device; and
wherein supplying power via the energy storage device includes switching the output of the energy storage device from an output of a boost regulator to an input of the boost regulator; and
performing data hardening on the first section of the storage device.

18. The computer readable storage medium of claim 17, wherein switching the output of the energy storage device from the output of the boost regulator to the input of the boost regulator comprises switching the output of the energy storage device in response to receiving a first signal.

19. The computer readable storage medium of claim 18, wherein the first signal is a power fail signal generated by a first controller on the storage device.

20. The computer readable storage medium of claim 18, wherein the first signal is a switchover signal, the switchover signal generated in response to a voltage output of the energy storage device falling below a predetermined threshold.

21. The computer readable storage medium of claim 20, wherein the predetermined threshold corresponds to a minimum input voltage required by a first regulator to supply useable power to the first portion of the storage device.

22. The computer readable storage medium of claim 17, wherein the energy storage device comprises one or more capacitors.

23. The computer readable storage medium of claim 17, further comprising utilizing the energy storage device to buffer power spikes received from the power source used during normal operation of the storage device.

24. The computer readable storage medium of claim 18, wherein the power fail operation is performed on the first section of the storage device in response to a second signal.

* * * * *